US010986697B2

(12) United States Patent
Estella Aguerri et al.

(10) Patent No.: US 10,986,697 B2
(45) Date of Patent: Apr. 20, 2021

(54) FRAME STRUCTURE AWARE COMPRESSION FOR MULTI-INPUT MULTI-OUTPUT (MIMO) SYSTEMS

(71) Applicant: Huawei Technologies Co., Ltd., Shenzhen (CN)

(72) Inventors: Inaki Estella Aguerri, Boulogne Billancourt (FR); Abdellatif Zaidi, Boulogne Billancourt (FR)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/729,011

(22) Filed: Dec. 27, 2019

(65) Prior Publication Data

US 2020/0186206 A1 Jun. 11, 2020

Related U.S. Application Data

(63) Continuation of application No. PCT/EP2017/074901, filed on Sep. 29, 2017.

(30) Foreign Application Priority Data

Jun. 28, 2017 (WO) ................ PCT/EP2017/065984

(51) Int. Cl.
*H04B 7/02* (2018.01)
*H04W 88/08* (2009.01)
(Continued)

(52) U.S. Cl.
CPC ........... *H04W 88/085* (2013.01); *H03M 7/40* (2013.01); *H04B 7/0413* (2013.01);
(Continued)

(58) Field of Classification Search
CPC ............. H04W 88/085; H04W 72/044; H04W 72/0446; H04W 72/0453; H04M 7/40;
(Continued)

(56) References Cited

U.S. PATENT DOCUMENTS

2012/0087358 A1 4/2012 Zhu et al.
2012/0176966 A1* 7/2012 Ling .................. H04W 88/085
370/328
(Continued)

FOREIGN PATENT DOCUMENTS

CN 102037694 A 4/2011
CN 102197629 A 9/2011
(Continued)

OTHER PUBLICATIONS

Peng et al., "Fronthaul—Constrained Cloud Radio Access Networks:Insights and Challenges," IEEE Wireless Communications, XP011579861, pp. 152-160, Institute of Electrical and Electronics Engineers, New York, New York (Apr. 2015).
(Continued)

*Primary Examiner* — Helene E Tayong
(74) *Attorney, Agent, or Firm* — Leydig, Voit & Mayer, Ltd.

(57) ABSTRACT

A multi-antenna apparatus of a multi-input multi-output (MIMO) communication system for compressing and decompressing a frequency domain digital signal are provided, wherein a data channel type of each frequency-domain digital sub-signal of the frequency-domain digital signal is determined by a radio frame structure map ($\pi$). The multi-antenna apparatus includes a respective compressor and a respective decompressor associated to each data channel type, and is configured, for each frequency-domain digital sub-signal of the frequency-domain digital signal, to compress, at a first module, the frequency-domain digital sub-signal using the compressor associated to the data channel type of the frequency-domain digital sub-signal, and, for each compressed frequency-domain digital sub-signal, to decompress, at a second module communicating with the first module via an FH link, the compressed frequency-domain digital sub-signal using the decompressor
(Continued)

associated to the data channel type of compressed frequency-domain digital sub-signal.

20 Claims, 15 Drawing Sheets

(51) Int. Cl.
*H04B 7/0456* (2017.01)
*H04B 7/06* (2006.01)
*H04W 72/04* (2009.01)
*H03M 7/40* (2006.01)
*H04B 7/0413* (2017.01)

(52) U.S. Cl.
CPC ......... *H04B 7/0456* (2013.01); *H04B 7/0626* (2013.01); *H04W 72/044* (2013.01); *H04W 72/0446* (2013.01); *H04W 72/0453* (2013.01)

(58) Field of Classification Search
CPC ... H04B 7/0413; H04B 7/0456; H04B 7/0626
USPC ........................................................ 375/267
See application file for complete search history.

(56) References Cited

U.S. PATENT DOCUMENTS

| | | | |
|---|---|---|---|
| 2013/0003817 | A1 | 1/2013 | Ling et al. |
| 2013/0287069 | A1* | 10/2013 | Su ................. H04B 7/0413 375/219 |
| 2015/0117277 | A1 | 4/2015 | Liu |
| 2017/0079059 | A1 | 3/2017 | Li et al. |

FOREIGN PATENT DOCUMENTS

| | | |
|---|---|---|
| CN | 103039029 A | 4/2013 |
| CN | 103222200 A | 7/2013 |
| CN | 105577598 A | 5/2016 |
| CN | 106453163 A | 2/2017 |
| KR | 20080068025 A | 7/2008 |
| WO | 2009009959 A1 | 1/2009 |
| WO | 2009151893 A2 | 12/2009 |

OTHER PUBLICATIONS

Vosoughi et al., "Baseband Signal Compression in Wireless Base Stations," Global Communications Conference (Globecom), Globecom 2012—Wireless Communications Symposium, pp. 4505-4511, Institute of Electrical and Electronics Engineers, New York, New York (Dec. 2012).

Chai et al., "SPIRO:Turning Elephants into Mice with Efficient RF Transport," 2015 IEEE Conference on Computer Communications (INFOCOM), XP055297615, pp. 819-827, Institute of Electrical and Electronics Engineers, New York, New York (Apr. 2015).

Guo et al., "CPRI compression transport for LTE and LTE-A signal in C-RAN," 2012 7th International ICST Conference on Communications and Networking in China (Chinacom), pp. 843-849, Institute of Electrical and Electronics Engineers, New York, New York (Aug. 2012).

Ren et al., "A Compression Method for LTE-A Signals Transported in Radio Access Networks," 2014 21st International Conference on Telecommunications (ICT), XP032612089, pp. 293-297, Institute of Electrical and Electronics Engineers, New York, New York (May 2014).

Nanba et al., "A New IQ Data Compression Scheme for Front-haul Link in Centralized RAN," 2013 IEEE 24th International Symposium on Personal, Indoor and Mobile Radio Communications: Workshop on Cooperative and Heterogeneous Cellular Networks, pp. 210-214, Institute of Electrical and Electronics Engineers, New York, New York (Sep. 2013).

Nieman et al., "Time-Domain Compression of Complex-Baseband LTE Signals for Cloud Radio Access Networks," Proc. IEEE Global Conference on Signal and Information Processing (Global-SIP), pp. 1198-1201, Institute of Electrical and Electronics Engineers, New York, New York (Dec. 2013).

Lorca et al., "Lossless Compression Technique for the Fronthaul of LTE/LTE-Advanced Cloud-RAN Architectures," 2013 IEEE 14th International Symposium on "A World of Wireless, Mobile and Multimedia Networks", pp. 1-9, (WoWMoM), Institute of Electrical and Electronics Engineers, New York, New York (Jun. 2013).

El Gamal et al., "Network Information Theory," total 714 pages, Cambridge University Press (2011).

CN/201780092458, Office Action, dated Oct. 30, 2020.

* cited by examiner

FRAME STRUCTURE AWARE COMPRESSION FOR MULTI-INPUT MULTI-OUTPUT (MIMO) SYSTEMS

CROSS-REFERENCE TO RELATED APPLICATIONS

This application is a continuation of International Application No. PCT/EP2017/074901, filed on Sep. 29, 2017, which claims priority to International Application No. PCT/EP2017/065984, filed on Jun. 28, 2017. The disclosures of the aforementioned applications are incorporated by reference herein in their entireties.

TECHNICAL FIELD

The present invention relates to the field of wireless communications, and more particularly to the field of cloud communications over distributed nodes connected through fronthaul (FH) links.

BACKGROUND

Massive multi-input multi-output (M-MIMO) systems operating over large bandwidths are considered to be one of the most promising technologies to increase the spectral efficiency in next-generation cellular systems. The most popular implementation for M-MIMO stations relies on a distributed architecture, in which the base station (BS) base band (BB) processing (e.g., beamforming and waveform generation) and the radio processing (e.g., radio frequency (RF) processing and analog-to-digital conversion (ADC) or digital-to-analog conversion (DAC)) are respectively carried out by separate units such as a base band unit (BBU) on one hand and remote radio units (RRUs), also known as radio resource units (RRUs), on the other hand, which are usually remotely located. One or more RRUs, each formed, for example, of blocks of antennas, can be connected to the BBU through respective FH links (e.g., optical fibers), which transmit in-phase and quadrature (IQ) samples between an RRU and a BBU, as schematically depicted in the MIMO system 100 of FIG. 1. The user equipment (UE) devices, as transmitters, transmit a respective message towards a MIMO receiver over a frequency selective channel, and the MIMO receiver internally transmits, over an FH link, uplink IQ samples from the RRU towards the BBU. On the other hand, a MIMO transmitter internally transmits, over the FH link, downlink IQ samples from the BBU towards the RRU and externally transmits, over the frequency selective channel, a respective message towards the UE devices, as receivers. The RRU can be installed close to the antennas, while the BBU can be located at the base of a building or at a remote location, thereby reducing the cost and adding flexibility to the deployment of the BSs. In a downlink, for example, the BBU unit is in charge of the BB processing functionalities such as the bit level encoding of the users' messages to IQ symbol samples, the precoding of the users' signals and the frequency domain functionalities (e.g., inverse fast Fourier transform (IFFT) and cyclic prefix (CP) addition for orthogonal frequency division multiplexing (OFDM) waveforms) in order to generate the transmit signal. These IQ samples are forwarded towards the RRU, which simply applies the DAC operations and transmits the signal.

The throughput requirements of the FH links in terms of communication of the IQ samples between the BBU and the RRUs can become easily prohibitive in the case of high bandwidths and a large number of antennas. It is the reason why many common public radio interface (CPRI) compression algorithms have been considered in the literature (e.g., K. F. Nieman and B. L. Evans, "Time-domain compression of complex-BB long-term evolution (LTE) signals for cloud radio access networks", Proc. IEEE Global Conference on Signal and Information Processing (Global-SIP), pp. 1198-1201, December 2013), in order to reduce the amount of data communicated between BBU and RRUs without significantly affecting the end-to-end (E2E) performance. For illustrative purposes, FIG. 2 shows a detailed view of a typical MIMO transmitter 200 within the MIMO system 100 of FIG. 1. The typical MIMO transmitter 200 comprises, at the BBU, a bit level processing block, a linear receive filtering block (depicted by "Pi"), a frequency processing block (depicted by "IFFT+CP") configured to perform an IFFT and a CP addition in the exemplary case of an OFDM waveform, and a compression algorithm block. The typical MIMO transmitter 200 comprises, at the RRU, a decompression algorithm block and a number of DAC devices.

While these compression algorithms can be applied straightforwardly in MIMO BSs in a per antenna basis, most of them are designed for single antenna devices and fail to exploit the particular features of multi-antenna BB signals, which are correlated not only over time samples but also over space, i.e., between the antennas. In addition, the number of received or transmitted beams (i.e., beamformed data streams) is usually much smaller than the number of antennas in the BS. This implies that the relevant information lies in a subspace of that in which the received signal lies. This sparsity in dimensionality can be exploited to improve the signal compression in addition to the correlation in time and space.

Moreover, transmitted and received signals using any standard (e.g., LTE and 5G) are highly structured into time domain and frequency domain resources. The corresponding structure is characterized by a radio frame structure as defined by any standard. For example, in LTE and 5G, the minimum scheduling unit is a physical resource block (PRB), which is composed of resource elements (REs). Each RE is mapped to different types of data channel, e.g., PSCH, SSCH, PBCH, RS, PCFICH, PHICH, PDCCH and PDSCH, as depicted in the downlink radio frame of FIG. 3. PSCH and SSCH are respective primary and secondary synchronization channels. PBCH, PCFICH, PDCCH and PHICH are control channels, which provide information needed to manage the transmission data on the user channels and facilitate a connection to the BS. PDSCH is a shared channel, which contains the data being sent towards the users. RS (also known as C-RS) is a cell-specific reference signal, which is transmitted on REs spread throughout the frame in specific locations as defined by the standard. The RS is used by the UEs to compensate the downlink frame for channel frequency response and cross-channel effects so that the signal can be demodulated.

Typically, signals of the same data channel type share similar spatial and temporal correlations, and significantly differ from those of other channel types. However, this situation does not normally occur in single antenna systems in which no spatial correlation does manifest, and can be exploited to design specific compression algorithms for the signals in each data channel type, resulting in an efficient compression.

SUMMARY

It is therefore an object of the present invention to decrease the communication requirements at a multi-antenna apparatus between one or more RRUs and one or more BBUs communicating to each other over a communication link of a given throughput, while guaranteeing an E2E goal of low distortion or error vector magnitude (EVM) between the symbols intended for each user at the BBUs and the symbols received at the corresponding users in the downlink, and between the transmitted users' signals and their reconstruction at the destination in the uplink.

The object is achieved by the features of the independent claims. Further embodiments of the invention are apparent from the dependent claims, the description and the drawings.

According to a first aspect, the invention relates to a multi-antenna apparatus within a MIMO communication system for compressing and decompressing a frequency-domain digital signal. The frequency-domain digital signal is composed of frequency-domain digital sub-signals and is allocated to a respective resource block (RB). Each RB comprises multiple REs according to a frequency-time grid. Each frequency-domain digital sub-signal is allocated to a respective RE of the RB. Each frequency-domain digital sub-signal has a data channel type amongst at least one data channel type, the data channel type of each frequency-domain digital sub-signal being determined by a radio frame structure map. The multi-antenna apparatus comprises a respective compressor and a respective decompressor associated to each data channel type. The multi-antenna apparatus is configured, for each frequency-domain digital sub-signal of the frequency-domain digital signal, to compress, at a first module, the frequency-domain digital sub-signal using the compressor associated to the data channel type of the frequency-domain digital sub-signal. The multi-antenna apparatus is configured, for each compressed frequency-domain digital sub-signal, to decompress, at a second module communicating with the first module via a communication link, the compressed frequency-domain digital sub-signal using the decompressor associated to the data channel type of compressed frequency-domain digital sub-signal.

Thereby, the proposed invention is based on a set of compressors and decompressors that exploit the signal's radio frame structure and shows significant compression gains with respect to standard CPRI compression techniques. Furthermore, the communication link may, in an exemplary embodiment, be considered an FH link and the radio frame structure map ($\pi$) may be part of the information that defines, amongst others, the way the signal is organized and the type of data channel. Moreover, the compression and the decompression may be performed, in a non-restrictive manner, per RB, per group of RBs or per group of REs. In an exemplary case of the LTE standard, an RB may be defined as the smallest unit of resources that can be allocated to a user and each user is allocated a number of RBs in a two-dimensional grid, i.e., in a frequency-time grid.

According to an implementation form of the first aspect, the multi-antenna apparatus is configured to receive, from a signal generator at the first module, the frequency-domain digital signal and the radio frame structure map, to detect, at the first module, the frequency-domain digital sub-signals of the frequency-domain digital signal according to the data channel type determined by the radio frame structure map, and to select, at the first module, the respective compressor per data channel type in order to compress the detected frequency-domain digital sub-signals per data channel type.

According to a further implementation form of the first aspect, the multi-antenna apparatus is configured to compress, at the first module, the radio frame structure map using a lossless compressor.

According to a further implementation form of the first aspect, the multi-antenna apparatus is configured to determine, at the first module, a set of compression parameters, which are used for the compression of the detected frequency-domain digital sub-signals per data channel type.

According to a further implementation form of the first aspect, the multi-antenna apparatus is configured to transmit, the set of compression parameters, the compressed radio frame structure map and the compressed frequency-domain digital sub-signals per data channel type, from the first module towards the second module via the communication link.

According to a further implementation form of the first aspect, the multi-antenna apparatus is configured to receive, at the second module, the set of compression parameters, the compressed radio frame structure map and the compressed frequency-domain digital sub-signals per data channel type, to decompress, at the second module, the compressed radio frame structure map using a lossless decompressor, as to obtain the radio frame structure map, to detect, at the second module, the compressed frequency-domain digital sub-signals of the compressed frequency-domain digital signal according to the data channel type determined by the radio frame structure map, and to select, at the second module, the respective decompressor per data channel type in order to decompress the compressed frequency-domain digital sub-signals per data channel type.

According to a further implementation form of the first aspect, the multi-antenna apparatus is configured to provide, at the second module, the set of compression parameters to each decompressor per data channel type, the set of compression parameters being used for the decompression of the detected compressed frequency-domain digital sub-signals per data channel type.

According to a further implementation form of the first aspect, the multi-antenna apparatus is configured to reconstruct, at the second module, the frequency-domain digital signal using the decompressed compressed frequency-domain digital sub-signals and the radio frame structure map, wherein the reconstructed frequency-domain digital signal is composed of all the decompressed compressed frequency-domain digital sub-signals allocated to all the REs of the respective RB.

According to a further implementation form of the first aspect, the multi-antenna apparatus is configured to convert, at the second module, the reconstructed frequency-domain digital signal to a time-domain digital signal.

According to a further implementation form of the first aspect, the first module is a BBU and the second module is an RRU.

Thereby, the multi-antenna apparatus is a transmitter.

According to a further implementation form of the first aspect, the first module is an RRU and the second module is a BBU.

Thereby, the multi-antenna apparatus is a receiver.

The above object is also solved in accordance with a second aspect.

According to the second aspect, the invention relates to a multi-antenna system comprising at least one multi-antenna apparatus as claimed in the first aspect and/or in any one of the implementation forms of the first aspect.

The above object is also solved in accordance with a third aspect.

According to the third aspect, an apparatus comprises the first module as specified in the first aspect and in any one of the implementation forms of the first aspect.

The above object is also solved in accordance with a fourth aspect.

According to the fourth aspect, an apparatus comprises the second module as specified in any one of the implementation forms of the first aspect.

The above object is also solved in accordance with a fifth aspect.

According to the fifth aspect, a method for compressing and decompressing a frequency-domain digital signal within a MIMO communication system, wherein the frequency-domain digital signal is composed of frequency-domain digital sub-signals and is allocated to a respective RB, each RB comprising multiple REs according to a frequency-time grid, wherein each frequency-domain digital sub-signal is allocated to a respective RE of the RB, wherein each frequency-domain digital sub-signal has a data channel type amongst at least one data channel type, the data channel type of each frequency-domain digital sub-signal being determined by a radio frame structure map. The method comprises, for each frequency-domain digital sub-signal of the frequency-domain digital signal, the step of compressing, at a first module, the frequency-domain digital sub-signal using a compressor associated to the data channel type of the frequency-domain digital sub-signal, and, for each compressed frequency-domain digital sub-signal, the step of decompressing, at a second module communicating with the first module via a communication link, the compressed frequency-domain digital sub-signal using a decompressor associated to the data channel type of compressed frequency-domain digital sub-signal.

According to an implementation form of the fifth aspect, the method comprises the step of receiving, from a signal generator at the first module, the frequency-domain digital signal and the radio frame structure map, the step of detecting, at the first module, the frequency-domain digital sub-signals of the frequency-domain digital signal according to the data channel type determined by the radio frame structure map, the step of selecting, at the first module, the respective compressor per data channel type in order to compress the detected frequency-domain digital sub-signals per data channel type, and the step of compressing, at the first module, the radio frame structure map using a lossless compressor.

According to a further implementation form of the fifth aspect, the method comprises the step of receiving, at the second module, a set of compression parameters from the first module, the compressed radio frame structure map and the compressed frequency-domain digital sub-signals per data channel type, the step of decompressing, at the second module, the compressed radio frame structure map using a lossless decompressor, as to obtain the radio frame structure map, the step of detecting, at the second module, the compressed frequency-domain digital sub-signals of the compressed frequency-domain digital signal according to the data channel type determined by the radio frame structure map, and the step of selecting, at the second module, the respective decompressor per data channel type in order to decompress the compressed frequency-domain digital sub-signals per data channel type.

According to a further implementation form of the fifth aspect, the method comprises the step of reconstructing, at the second module, the frequency-domain digital signal using the decompressed compressed frequency-domain digital sub-signals and the radio frame structure map, wherein the reconstructed frequency-domain digital signal is composed of all the decompressed compressed frequency-domain digital sub-signals allocated to all the REs of the respective RB.

The above object is also solved in accordance with a sixth aspect.

According to the sixth aspect, the invention relates to a computer program comprising a program code for performing the method according to the fifth aspect and/or any one of the implementation forms of the fifth aspect, when executed on a computer.

Thereby, the method can be performed in an automatic and repeatable manner.

The computer program can be performed by the above apparatuses.

More specifically, it should be noted that all the above apparatuses may be implemented based on a discrete hardware circuitry with discrete hardware components, integrated chips or arrangements of chip modules, or based on a signal processing device or chip controlled by a software routine or program stored in a memory, written on a computer-readable medium or downloaded from a network such as the Internet.

It shall further be understood that a preferred embodiment of the invention can also be any combination of the dependent claims or above embodiments with the respective independent claim.

These and other aspects of the invention will be apparent and elucidated with reference to the embodiments described hereinafter.

BRIEF DESCRIPTION OF THE DRAWINGS

In the following detailed portion of the present disclosure, the invention will be explained in more detail with reference to the exemplary embodiments shown in the drawings, in which.

Identical reference signs are used for identical or at least functionally equivalent features.

DETAILED DESCRIPTION OF EMBODIMENTS OF THE INVENTION

For ease of exposition, the present invention will be based, in the following description, on the MIMO transmitter 200 of the MIMO system 100, which transmits, over a communication link (e.g., an FH link), downlink IQ samples from a BBU through a compression algorithm block towards an RRU through a decompression algorithm block. Nevertheless, in reference to FIG. 4, the present invention may also be based on the MIMO receiver 300 of the MIMO system 100, which transmits, over a communication link (e.g., an FH link), uplink IQ samples from an RRU through a compression algorithm block towards a BBU through a decompression algorithm block. In more details, in the uplink scenario of FIG. 4, the RRU applies the RF processing and the analog-to-digital processing (ADC) operations to obtain a digitized version of the received signal, while the BBU is in charge of the BB processing functionalities of the uplink IQ samples from the RRU, such as the frequency domain functionalities (e.g., FFT and CP removal in the case of OFDM waveforms), receive filtering (depicted by "$P_i$") and bit level processing. At the RRU, the compressor receives the samples from a plurality of antennas and compresses them according to an uplink radio frame determined by the corresponding mobile standard.

Figure 5:
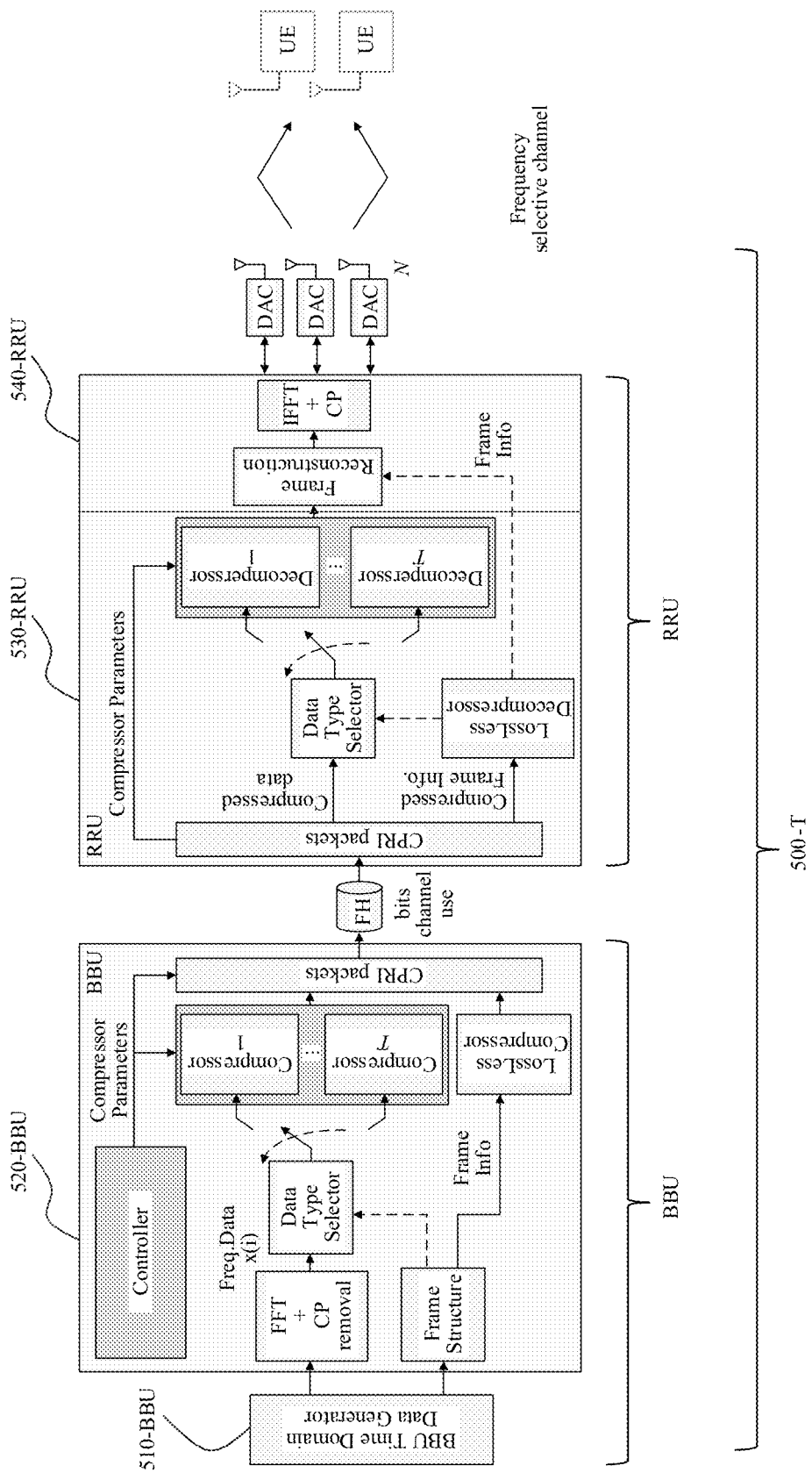
FIG. 5 shows a downlink multi-user MIMO (MU-MIMO) communication system in which a MIMO transmitter transmits, over an FH link, downlink IQ samples from a BBU through a compression algorithm block towards an RRU through a decompression algorithm block, according to an embodiment of the present invention.

FIG. 5 shows a downlink MU-MIMO communication system 500 in which a MIMO transmitter 500-T transmits, over an FH link, downlink IQ samples from a BBU through a compression algorithm block towards an RRU through a decompression algorithm block, according to an embodiment of the present invention.

As illustrated in FIG. 5, the downlink MU-MIMO communication system 500 comprises a MIMO transmitter 500-T which is a MU transmitter transmitting towards one or more UEs over a frequency selective channel. The MIMO transmitter 500-T comprises a BBU and an RRU which communicate between themselves through the FH link as a communication link of a given throughput. The BBU may comprise a signal generator 510-BBU (depicted as "BBU time domain data generator") which is configured to generate a time-domain digital signal, and a compression unit 520-BBU. The RRU may comprise a decompression unit 530-RRU and a BB signal reconstruction unit 540-RRU. The MIMO transmitter 500-T may be equipped with N antennas and apply RF and DAC processing at each antenna in order to generate the analog signal to transmit towards the one or more UEs from the frequency-domain digital signal received from the BBU via the finite throughput FH link.

In the following and in a non-limiting manner, an LTE/5G OFDM-type waveform, e.g., an orthogonal frequency division multiple access (OFDMA) waveform, with $N_c$ subcarriers and $N_g$ samples of CP, will be considered. It should be noted that in the case of an uplink MU-MIMO communication system, the LTE/5G OFDM-type waveform might, for example, be a single-carrier frequency division multiple access (SC-FDMA) waveform.

Figure 6:
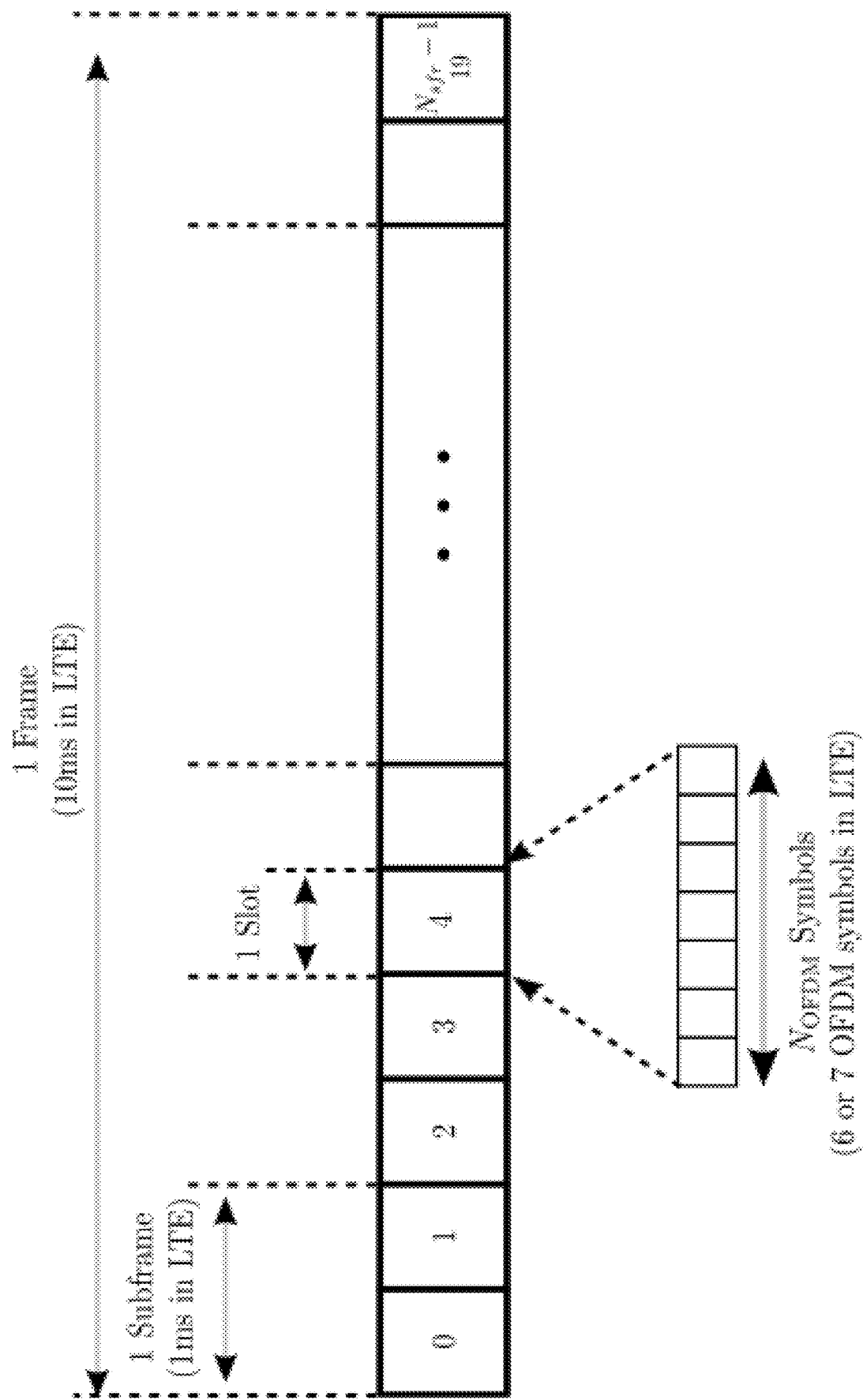
FIG. 6 shows a radio frame structure applied to an LTE/5G OFDM-type waveform, according to an embodiment of the present invention.

The signal corresponding to the LTE/5G OFDM-type waveform is organized in frequency and time according to the radio frame structure as shown in FIG. 6. The basic LTE/5G OFDM-type frame is divided into $N_{sf}$ subframes, each of duration $T_{sf}$. Each subframe is formed by $N_{sl}$ slots of duration $T_{slot}$. In each subframe, $N_s$ OFDM symbols per antenna are assumed to be transmitted. Each OFDM symbol consists of $N_c$ data symbols and $N_g$ samples of CP. In total, an OFDM symbol has $N_{tot}=(N_c+N_g)$ symbols. For example, the basic type 1 LTE frame has an overall length of 10 milliseconds (ms), and each frame is divided into a total of 20 individual subframes, each subframe consisting of two slots. That is, there are 10 LTE subframes of 1 ms within a frame.

Figure 7:
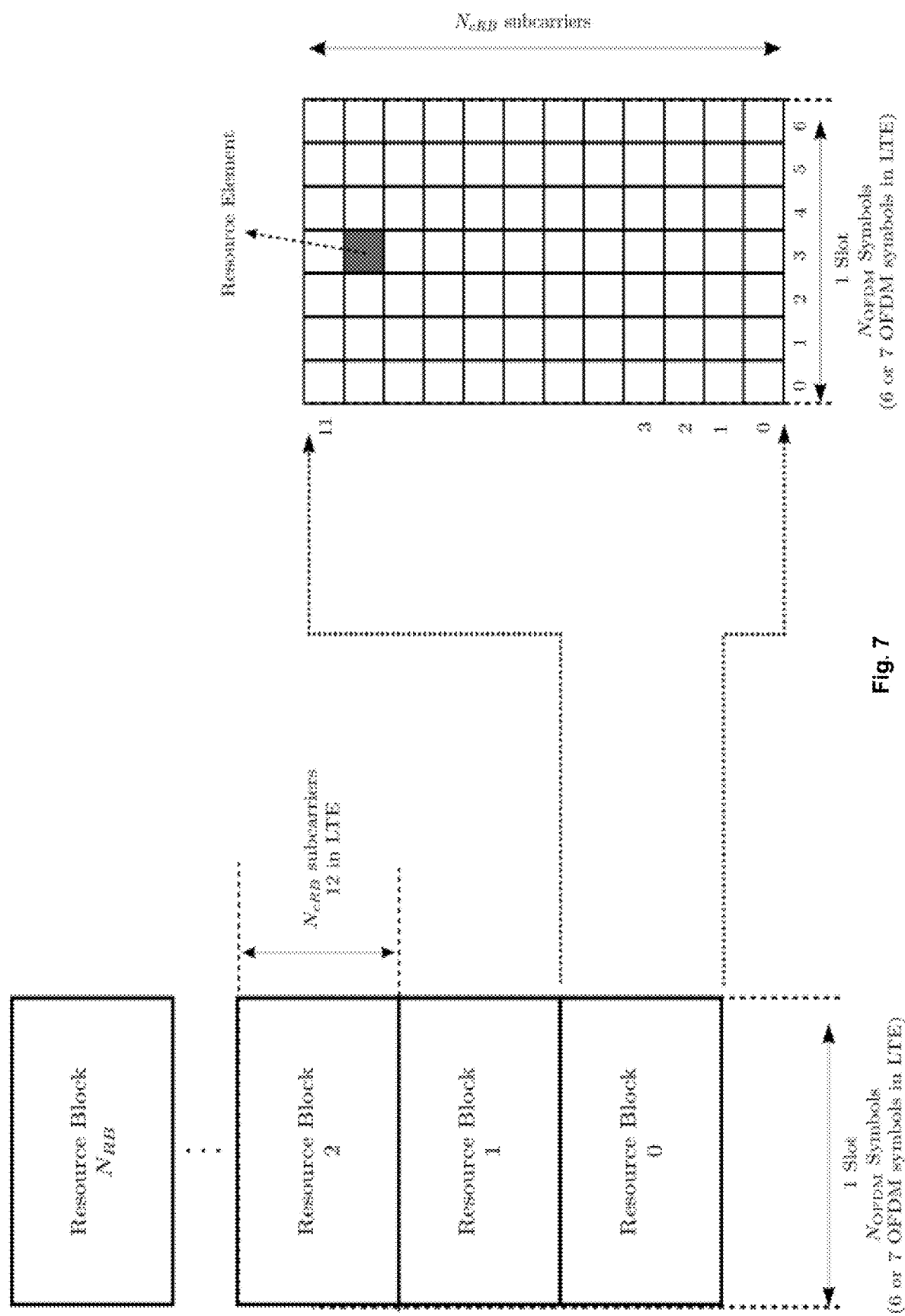
FIG. 7 shows a relationship between slots, symbols and RBs, according to an embodiment of the present invention.

The smallest modulation structure is the RE. An RE is one subcarrier element, e.g., of 15 kilohertz (kHz), by one symbol. As depicted in FIG. 7 showing a relationship between slots, symbols and RBs, the REs aggregate into RBs, which have a dimension of subcarriers per symbol, i.e., $N_{cRB}$ consecutive subcarriers in the frequency domain and $N_{sym}$ symbols form each RB. In total, the $N_c$ subcarriers are divided into $(N_{RB}+1)$ RBs.

Figure 1:
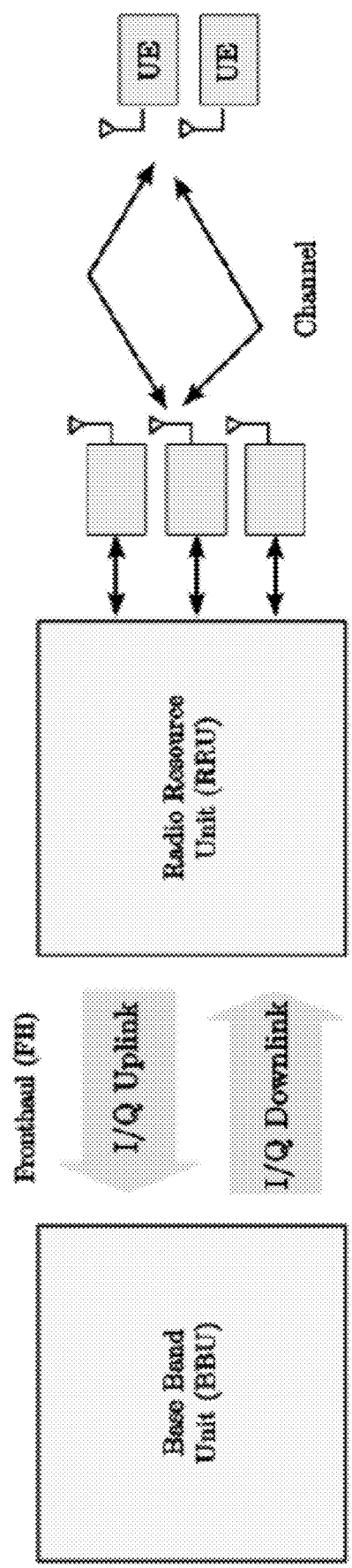
FIG. 1 shows a typical MIMO system, which exchange uplink and downlink IQ samples between an RRU and a BBU over an FH link.
Figure 2:
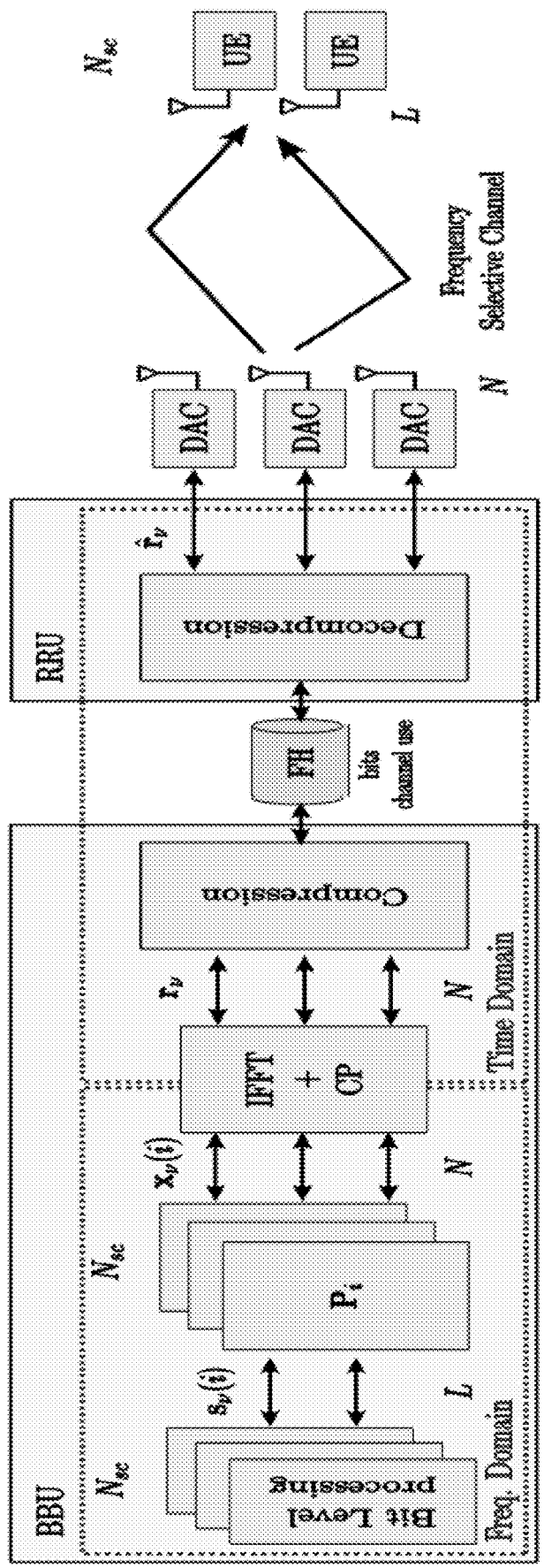
FIG. 2 shows a detailed view of a typical MIMO transmitter, which transmits, over an FH link, downlink IQ samples from a BBU through a compression algorithm block towards an RRU through a decompression algorithm block.
Figure 3:
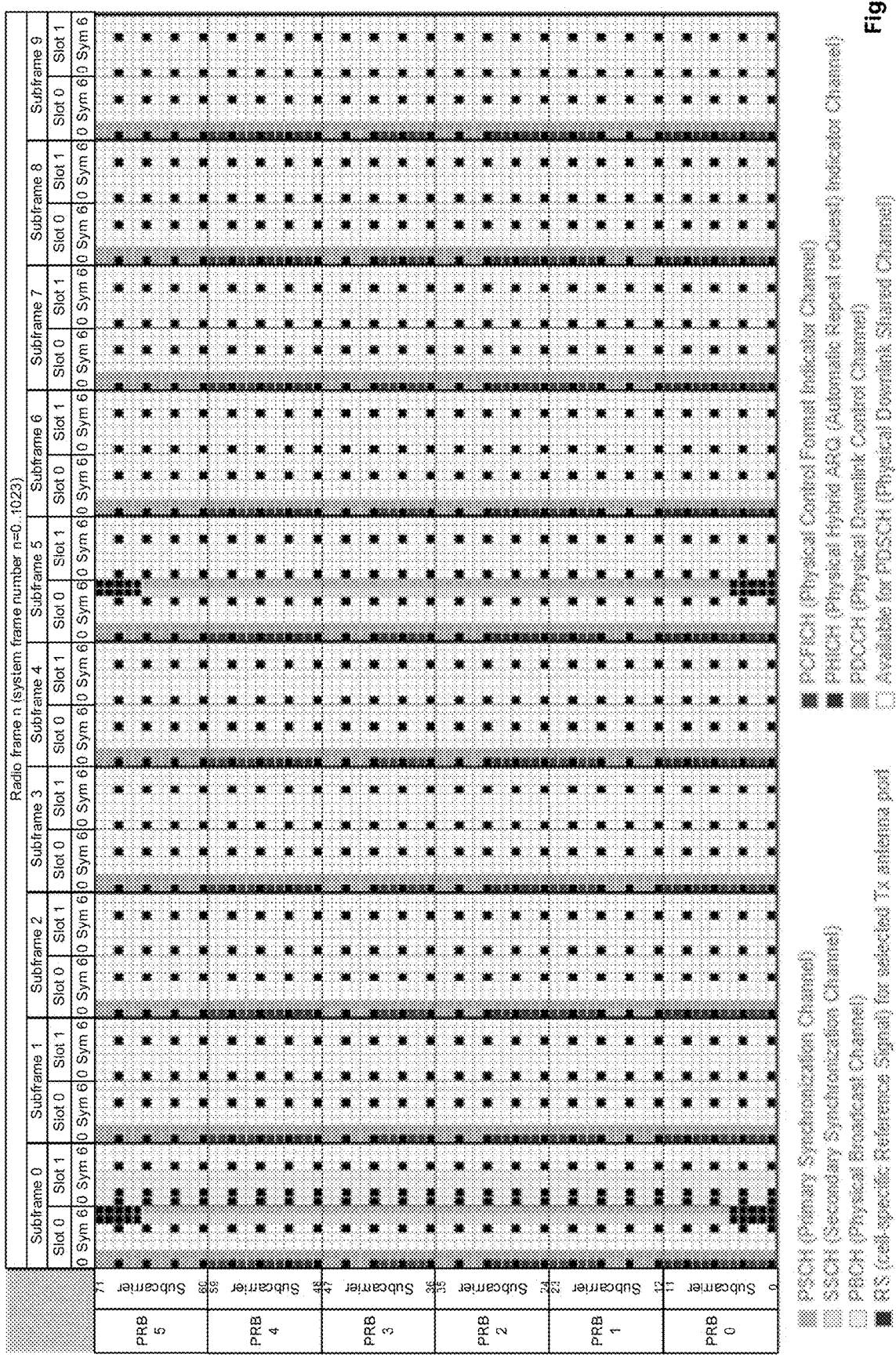
FIG. 3 shows an exemplary diagram of a downlink radio frame and an RE mapping.
Figure 8:
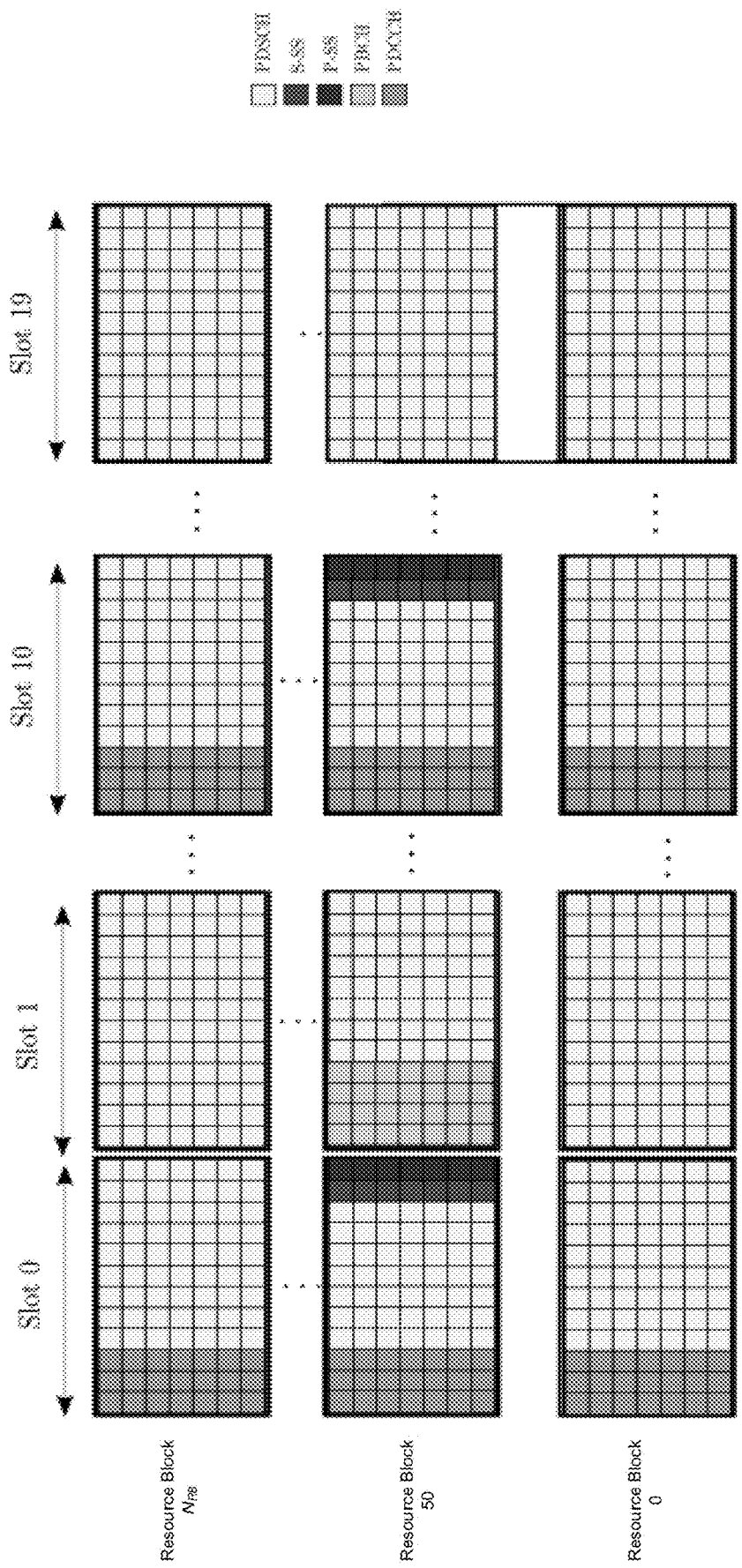
FIG. 8 shows an exemplary location of data channel types according to a radio frame structure map, according to an embodiment of the present invention.

Referring to FIG. 3 and FIG. 8, each RE in the frequency-time resource grid carries physical channels and physical signals. The REs within the frame are assigned a data channel type depending on the data type carried by themselves. For example, the REs assigned to the physical downlink shared channel (PDSCH) are used to transport user data, whereas the REs assigned to the physical broadcast channel (PBCH) are used to send cell specific system identification information and access control parameters. The association of each RE in the radio frame structure is determined by the radio frame structure map as defined by the used standard.

In the following, it is assumed that there are t different data channel types, where t∈{1, . . . , T}, and that each RE is assigned a data channel type according to the radio frame structure map. The corresponding mapping ($\pi$), relating the RB number, the slot number ({0, . . . , $N_{slots}$}), the subcarrier number ({0, . . . , $N_{sc}$}) and the OFDM symbol number ({0, . . . , $N_{sym}$}) to the data channel type ({1, . . . , T}) according to the used standard, may be defined as follows:

$$\pi: \{0,\ldots,N_{sc}\}\times\{0,\ldots,N_{slots}\}\times\{0,\ldots,N_{sym}\}\to\{1,\ldots,T\} \quad (1)$$

Given an RB number, a slot number, a subcarrier number and an OFDM symbol index, the radio frame structure map gives the corresponding data channel type to the RE denoted by the class 1 to T, the radio frame structure map being determined by the standard.

In an alternative exemplary embodiment, a data channel type t may be formed by a group of several data channel types and may be processed as if it was a single data channel type.

Figure 9:
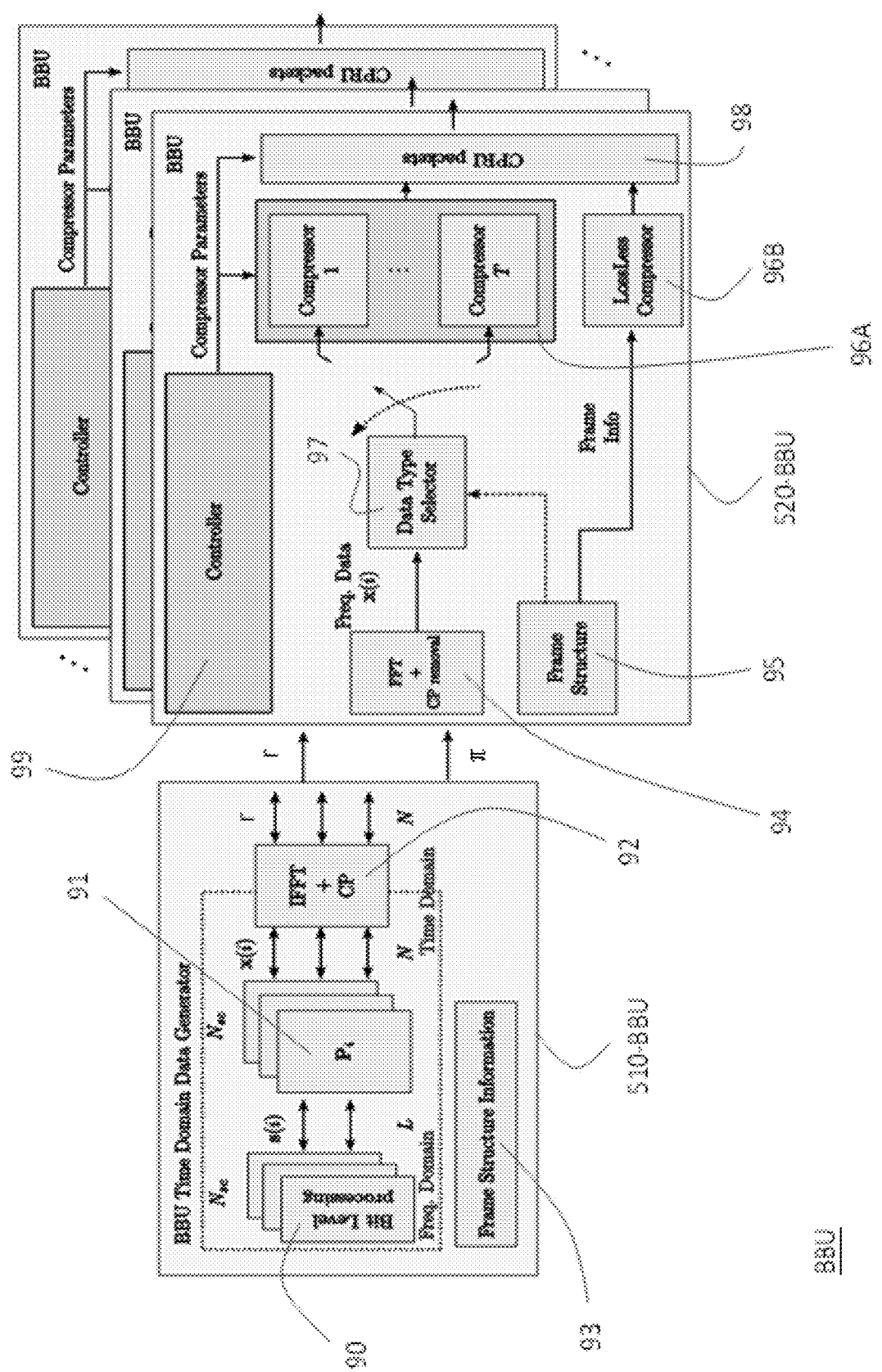
FIG. 9 shows a detailed view of the BBU of the MIMO transmitter, according to an embodiment of the present invention.

Referring to the downlink MU-MIMO communication system 500, FIG. 9 shows a detailed view of the BBU (i.e., the signal generator 510-BBU and the compression unit 520-BBU) of the MIMO transmitter 500-T, according to an embodiment of the present invention.

The operation of the signal generator 510-BBU will be now described in a more detailed manner. Although applicable to multiple RBs and OFDM symbols, the operation will consider, only for purposes of simplicity, a single RB and a BB signal generation by the BBU for a single OFDM symbol, each OFDM symbol in the slot being similarly generated.

Let $i \in \{1, \ldots, N_{sc}\}$ denote the subcarrier index, $j \in \{0, \ldots, N_{slots}\}$ denote the slot index and $k \in \{0, \ldots, N_{sym}\}$ denote the OFDM symbol. The bit-level processing module 90 outputs L symbols $S(i, j, k)$, where $S(i, j, k) \in \mathbb{C}^L$, to transmit according to some constellation (e.g., coming from the concatenation of a quadrature amplitude modulation (QAM) with forward-error-correcting (FEC) codes) and over the RE that is associated to the i-th subcarrier at the j-th slot and the k-th OFDM symbol at the corresponding RB. It is assumed that the data channel type according to the radio frame structure map is $t \in \{1, \ldots, T\}$, i. e., $\pi(i, j, k)=t$. Furthermore, it is assumed that $S(i, j, k)$ is zero mean and has a covariance $C_s(i, j, k) = \text{snr } I$, where I is the identity matrix and snr is the power of each symbol, the symbols being uncorrelated among the carriers, i.e., $E[s(i, j, k)s(i', j, k)^H] = 0$, for $i' \neq i$ where H is the hermitian operator.

The input signal $S(i, j, k)$ is precoded with a precoder 91 using a filtering coefficient $P_{i,j,k}$, where $P_{i,j,k} \in \mathbb{C}^{L \times N}$, in order to generate the frequency-domain digital signal $X(i, j, k)$ to transmit at the RE corresponding to the i-th subcarrier, the j-th slot and the k-th OFDM symbol, and denoted by:

$$X(i,j,k)=S(i,j,k) \quad (2)$$

The signal $X(i, j, k)$ is allocated to the RE in the frequency-time grid determined by the radio frame structure, corresponding to the i-th subcarrier, the j-th slot and the k-th OFDM symbol.

In the same RB, all the REs of data channel type t are precoded with the same precoder 91, whereas in different RBs, all the REs of data channel type t are precoded with different precoders 91 per RB. It should be noted that the signal $X(i, j, k)$ in REs of data channel type t in a given RB have a similar correlation matrix $C_x(i, j, k)$, which however changes over different slots j and is defined as follows:

$$C_x(i,j,k)=E[X(i,j,k)X(i,j,k)^H]=\text{snr } P_j^t P_j^{t,H} \text{ for } \pi(i,j,k)=t \quad (3)$$

where $P^t$ is the precoder of data channel type t, that is, $P_{i,j,k}=p_j^t$ if $\pi(i, j, k)=t$.

Then, the signal generator 510-BBU generates (e.g., using an OFDM-like modulation with IFFT and CP addition through the depicted module 92) a time-domain digital signal r to transmit towards the compression unit 520-BBU.

In an alternative exemplary embodiment, the signal generator 510-BBU may not generate the time-domain digital signal r. In other terms, the signal generator 510-BBU may not apply an OFDM-like modulation operation with IFFT and CP addition and may instead provide the digital signal X assigned to all the REs in the frequency-domain grid directly towards the compression unit 520-BBU. The frequency-domain digital signal X is thus composed of the overall frequency-domain digital signals $X(i, j, k)$, which will be also designated in the present invention as frequency-domain digital sub-signals $X(i, j, k)$ with respect to the frequency-domain digital signal X. As the conversion from the frequency domain to the time domain is thereby removed, then the compression unit 520-BBU does not need to use an OFDM-like modulation operation with FFT and CP removal to perform a conversion to the frequency-domain.

The compression unit 520-BBU receives, from the signal generator 510-BBU, the time-domain digital signal r and the radio frame structure map π, which is provided by the frame structure information module 93 and stored into the frame structure module 95. The compression unit 520-BBU applies an OFDM-like modulation operation with FFT and CP removal through the module 94 to obtain the frequency-domain digital signal X. The frequency-domain digital sub-signals $X(i, j, k)$ of the frequency-domain digital signal X are detected according to the data channel type t (where $t \in \{1, \ldots, T\}$) determined by the radio frame structure map π. Depending on the data channel type t determined by the radio frame structure map π, a respective compressor (compressor 1, ..., compressor t, ..., compressor T) amongst a set of T compressors 96A (where each compressor is associated to a respective data channel type t) is selected by the data channel type selector 97 in order to generate the compressed message $M_t$ for the data channel type t, i.e., the compressed detected frequency-domain digital sub-signals per data channel type t. The radio frame structure map π is also compressed using a lossless compressor 96B. The compressed radio frame structure map π as a message $M_{RFS}$ and the compressed message for each data channel type are sent through a CPRI 98 towards the decompression unit 530-RRU. Further, the depicted controller 99 is configured to determine and control the compression parameters of the T compressors 96A. In an exemplary embodiment, the controller 99 may accommodate the CPRI packets within the CPRI interface 98 and the FH resources allocated to each compression type. The formatting of the CPRI packets (or FH packet transmitted) over the FH link may accommodate different formats to transmit the quantized data and the overhead (including bit allocation, dimension of the projection, and effective energy per projected dimension) required for the decompression at the RRU.

While considering the compression of the frequency-domain digital sub-signals $X(i, j, k)$ of the frequency-domain digital signal X for each RB independently, the compressor t for the data channel type t in a RB operates as follows. Let $X_t$ denote the samples in an arbitrary RB corresponding to the REs of class t. The samples $X_t$ are compressed using the compressor t at $B_t$ samples per sample $X(i, j, k)$ in $X_t$ in order to generate the message $M_{t,k}$ containing the samples compression bits of the signal in the REs of type t in the k-th slot for the considered RB. This may be carried out, for example, by means of a vector transform coding algorithm to generate the compression message $M_t$ of rate $B_t$ bits per sample utilizing the covariance matrix $C_x(t, j)$ of the samples of class t as hereafter. The singular value decomposition (SVD) of the covariance matrix $C_x(t, j)$ is computed as $C_x(t, j)=U_{t,j}\Lambda_{t,j}U_{t,j}^T$. Note that the frequency-domain digital sub-signals $X(i, j, k)$ in REs of type t in a given RB have a similar correlation matrix that however changes over different slots such that, at the j-th slot, the samples $X(i, j, k)$ of type t have the following covariance matrix:

$$C_x(t,j)=E[X(i,j,k)X(i,j,k)^H]=\text{snr } P_j^t P_j^{t,H} \text{ for } \pi(i,j,k)=t \quad (4)$$

Each sample $X(i, j, k)$ in $X_t$ is multiplied with $U_{t,j}$ as to obtain: $\tilde{X}(i, j, k)=U_{t,j} \cdot X(i, j, k)$ for $\pi(i, j, k)=t$. Then, each of the N components of $\tilde{X}(i, j, k)$ is quantized at $b_{t,l}$, where $l=1, \ldots, N_t'$ such that $b_{t,1}, \ldots, b_{t,l}$, are obtained with the following reverse water filling problem:

$$(b_{t,1}, \ldots, b_{t,N}) = \operatorname{argmin} \sum_{l=1}^{N} \log\left(\frac{\lambda_{t,l}}{d_{t,l}}\right), \text{ s.t. } \sum_{l=1}^{N} b_{t,l} = B_t \quad (5)$$

where $d_{t,l} = \min\{\lambda_{t,l}, \theta\}$ where $\lambda_{t,l}$ is the $n_l$-th eigenvalue of $C_x(t, j)$ and $\theta$ is chosen such that the constraint is met. Let $N_t' \leq N$ be the integer such that that $b_{t,1}, \ldots, b_{t,N'} > 0$ and $b_{t,N'} = \ldots = b_{t,N}$. For example, the N components of $\tilde{X}(i, j, k)$ are quantized at $b_{t,l}$ by quantizing the first N' components of $\tilde{X}(i, j, k)$ by a sample-by-sample uniform quantizer with $2^{b_{t,l}}$ levels. The number of bits per component $(b_{t,1}, \ldots, B_{t,N'})$ and the dimension N' are determined by the controller 99. After compression, the resulting $(B_1 + \ldots + B_{N'})$ bits per sample are forwarded through the CPRI interface 98 towards the decompression unit 530-RRU as the message $M_t$, together with the parameters required for decompression such as the dimension per class $N_t'$, the allocated bits per dimension $b_{t,1}, \ldots, b_{t,N'}$, the amplitudes $\lambda_{t,1}, \ldots \lambda_{t,N'}$ and the N' first columns of the transformation $U_{t,j}$. This operation is performed for each data channel type t, where $t \in \{1, \ldots, T\}$.

In another exemplary embodiment, instead of having each compressor associated to a respective data channel type t, a same compressor may be associated to a group of multiple data channel types as if these associated data channel types were from the same data channel type class. In such a case, the covariance of the group may then be found by direct estimation, for example, by considering the average between the covariance matrix of the several data channel types involved in the grouping.

Figure 10:
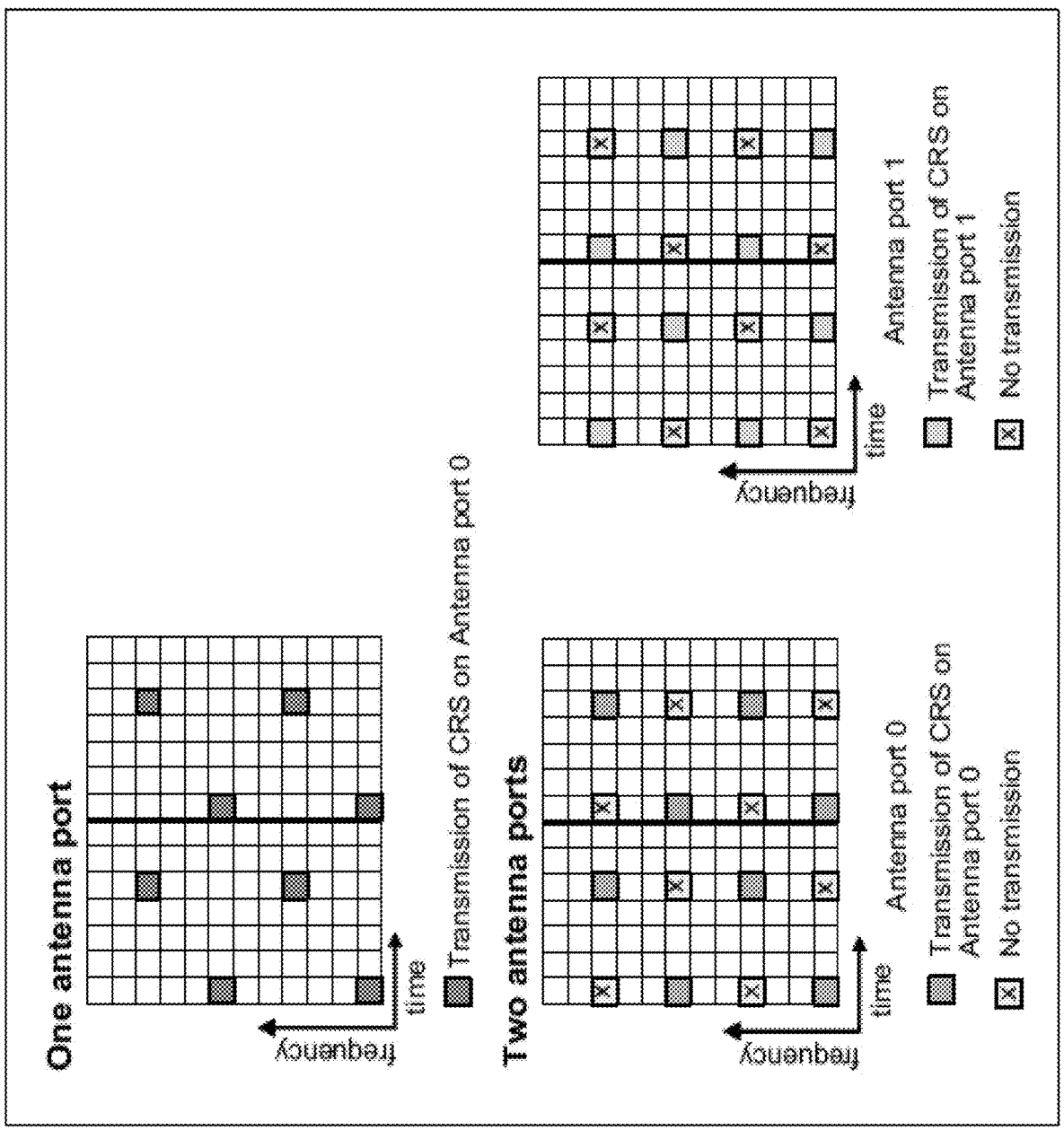
FIG. 10 shows an example of possible configurations of C-RS data channel type for one and two antenna ports, according to an embodiment of the present invention.

On the other hand, the radio frame structure map π is compressed in a lossless manner and sent through the CPRI interface 98 towards the decompression unit 530-RRU. The radio frame structure is very structured as only a finite number of configurations of data channel type assignments is considered in the standards. Most parts of the radio frame structure map π are static during the whole transmission and determined by the standard, and can be forwarded towards the decompression unit 530-RRU at the beginning of the transmission. The dynamic parts of the radio frame structure map π can be forwarded periodically by generating an indexing of the radio frame structure elements. For example, two types of indexing may be considered. The first type is related to a compression according to patterns or configurations: the radio frame structure map information follows a predetermined pattern for a certain channel type and only requires to forward the configuration number among the set of all possible configurations. The number of bits is then equal to: # variable classes×log(# configurations in class). The second type is related to a compression through a subcarrier position in a RB: the subcarriers that are in a RB can be labelled with $n \in \{1, 2, \ldots, N_{cRB} \times N_{OFDM}\}$. Thus, forwarding the class type of each dynamic element in the RB requires a number of bits equal to: # variable classes×# symbolscalss×$\lceil \log(N_{OFDM} \times N_{scTTI}) \rceil$. For example, in FIG. 10, the encoding of C-RS data channel positions is considered in the case of one and two antenna ports. Encoding two dynamic patterns requires 1 bit. Encoding the position of 16 carriers in a RB of 14 OFDM symbols and 12 subcarriers, as in the LTE standard, requires 128 bits. The list of dynamic indexes can be further compressed with any lossless compression algorithm (e.g., the Huffman coding) and the compressed radio frame structure map message $M_{RFS}$ is forwarded towards the decompression unit 530-RRU at the RRU.

In an alternative exemplary embodiment in which the covariance matrix $C_t$ is unavailable, $C_t$ may then be estimated from the samples $X_t$ of type t from one or various RBs.

In another exemplary embodiment, the N components of $X_t$ may be compressed jointly or with any other compression algorithm.

Figure 11:
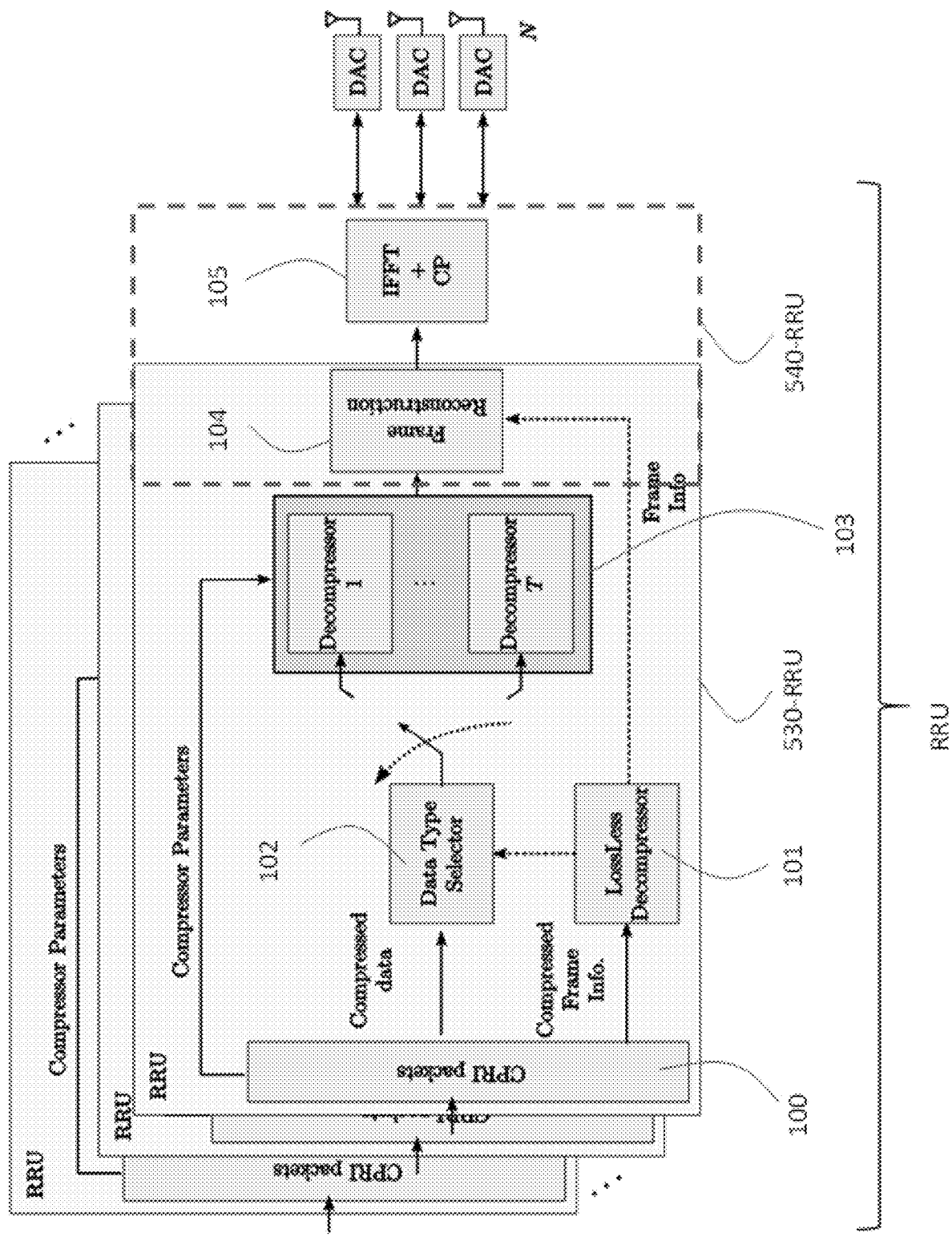
FIG. 11 shows a detailed view of the RRU (i.e., the decompression unit-RRU and the BB signal reconstruction unit-RRU) of the MIMO transmitter, according to an embodiment of the present invention.

Referring to the downlink MU-MIMO communication system 500, FIG. 11 shows a detailed view of the RRU (i.e., the decompression unit 530-RRU and the BB signal reconstruction unit 540-RRU) of the MIMO transmitter 500-T, according to an embodiment of the present invention.

The decompression unit 530-RRU receives, through a CPRI interface 100, the messages $M_1, \ldots M_T$ for each RB with the compression indices for the signal $X_t$ of each class for that RB and the overhead parameters required to decompress the signal $X_t$ of each class, namely the parameters such as the dimension per class $N_t'$, the allocated bits per dimension $b_{t,1}, \ldots, b_{t,N'}$, the amplitudes $\lambda_{t,1}, \ldots \lambda_{t,N'}$ and the N' first columns of the transformation $U_{t,j}$. The decompression unit 530-RRU also receives the compressed radio frame structure map π as the message $M_{RFS}$ sent by the compression unit 520-BBU at the BBU over the communication link such as the FH link.

First, the decompression unit 530-RRU decompresses, through a lossless decompressor 101, the compressed radio frame structure map π as the message $M_{RFS}$, in order to reconstruct the radio frame structure map π from the "losslessly" compressed bits of the message $M_{RFS}$ in accordance with the encoding (e.g. a lossless compression algorithm such as the Huffman coding) of the radio frame structure map π as above described.

Afterwards, the decompression unit 530-RRU detects the compressed frequency-domain digital sub-signals $\tilde{X}(i, j, k)$ of the compressed frequency-domain digital signal according to the data channel type t (where $t \in \{1, \ldots, T\}$) determined by the radio frame structure map π as reconstructed. Depending on the data channel type t determined by the radio frame structure map π as reconstructed, a respective decompressor (decompressor 1, ..., decompressor t, ..., decompressor T) amongst a set of T decompressors 103 (where each decompressor is associated to a respective data channel type t) is selected by the data channel type selector 102 in order to decompress the compressed message $M_t$ for the data channel type t, namely in order to decompress the compressed frequency-domain digital sub-signals per data channel type t. Thereby, the data $X_t$ of type t are reconstructed as data $\hat{X}_t$ of type t for each RB from the quantization bit components. In particular, the N' components of the projected signal $\tilde{X}_t(i, j, k)$ are reconstructed from the quantized version as $\tilde{\tilde{X}}_t(i, j, k)$ and then the signal $\hat{X}(i, j, k)$ is reconstructed as $\hat{X}(i, j, k) = U_t \tilde{\tilde{X}}_t(i, j, k)$. The reconstructed signal $\hat{X}_t$ of class t may be modelled as follows:

$$\hat{X}_t = X_t + Q_t \quad (6)$$

where $Q_t \sim N(0, U_t \Sigma_Q U_t^H)$ is the quantization noise, which may be assumed Gaussian independent and identically distributed (i.i.d.) and with a covariance matrix $\Sigma_{Q_t}$, which may, for example, be given by $\Sigma_{Q_t} = \operatorname{diag}(\lambda_{t,1} 2^{-B_{t,1}}, \ldots, \lambda_{t,N'} 2^{-B_{t,N'}})$.

In an alternative exemplary embodiment, the quantization noise may be modelled differently or with a covariance matrix other than $\Sigma_{Q_t}$.

The frame reconstruction module 104 of the BB signal reconstruction unit 540-RRU receives the radio frame structure map $\pi$ as reconstructed through the lossless decompressor 101 and the reconstructed BB signal $\hat{X}_t$ for each data type t, where $t \in \{1, \ldots, T\}$. The frame reconstruction module 104 generates the reconstruction of the frequency-domain digital BB signal X, denoted by $\hat{X}$, by allocating the reconstruction of each signal in each REs in the frequency-domain grid, i.e., $\hat{X}(i, j, k)$ in $\hat{X}_t$, to the corresponding RE allocation of X(i, j, k), as indicated by the radio frame structure map $\pi$. The BB signal reconstruction unit 540-RRU then applies an OFDM-like modulation operation with IFFT and CP addition through the module 105 to convert the reconstructed frequency-domain digital signal $\hat{X}$ to the time-domain digital signal, denoted by r, which is in turn converted to a time-domain analog signal using a DAC conversion prior to its transmission from the N antennas towards the UE devices, as illustrated in FIG. 5.

In the following, it will be assumed that, during a slot time, the channel $H_i$ observed in a subcarrier remains constant, varies amongst the subcarriers in the same RB according to a D taps Rayleigh fading model, and may be defined as follows:

$$H_i = \sum_{d=1}^{D-1} G(d) \exp\left(-j2\pi \frac{id}{N_{sc}}\right) \quad (7)$$

where G(d) is the matrix containing the d-th tap corresponding to the gains between the antennas and the users of the (D−1) finite impulse response (FIR) of the channel.

The time-domain analog signals received at the antennas of the UE devices are sampled and converted through an ADC conversion to a time-domain digital signal per antenna of the UE. The time-domain digital signal is processed using an OFDM-like modulation operation with FFT and CP removal to convert the time-domain digital signal to a frequency-domain digital signal. After this frequency-domain processing, the signal received at the i-th subcarrier at the j-th slot and the k-th OFDM symbol may be given by:

$$Y(i,j,k) = H_{i,j,k}\hat{X}(i,j,k) + Z(i,j,k) \quad (8)$$

where the channel matrix $H_{i,j,k}$ is defined as: $H_{i,j,k} = [h_{i,j,k,1}^T, \ldots, h_{i,j,k,N}^T]^T \in \mathbb{R}^{N_l \times K}$, where $h_{i,j,k,r} = [h_{i,j,k,r,1}, \ldots, h_{i,j,k,r,L}]^T$ and $h_{i,j,k,r,l}$ denotes the channel coefficient between the k-th receive antenna and the l-th user at the i-th subcarrier of the RB r, and Z(i,j,k) is the length $N_{OFDM}$ i.i.d. zero-mean additive noise vector sequence $Z(i, j, k) \in \mathbb{R}^N$ experienced at the N antennas with $C_z = \sigma^2 I$.

The symbol $\bar{X}(i, j, k)$ transmitted at the RE at the i-th subcarrier, the j-th slot, and ODFM symbol X(i, j, k), is estimated from the received signal using, for example, a minimum mean square error (MMSE) equalization, and may be given by:

$$\bar{X}(i,j,k) = snr\, H_{i,j,k}(H_{i,j,k}H_{i,j,k}^H + I)^{-1} Y(i,j,k) \quad (9)$$

In an alternative exemplary embodiment, the channel may be modelled with any alternative model, e.g. a model considering the variations of the channel over a transmission time interval (TTI).

In another exemplary embodiment, the transmitted symbol $\bar{X}(i, j, k)$ may be estimated by any other receive filter.

Figure 4:
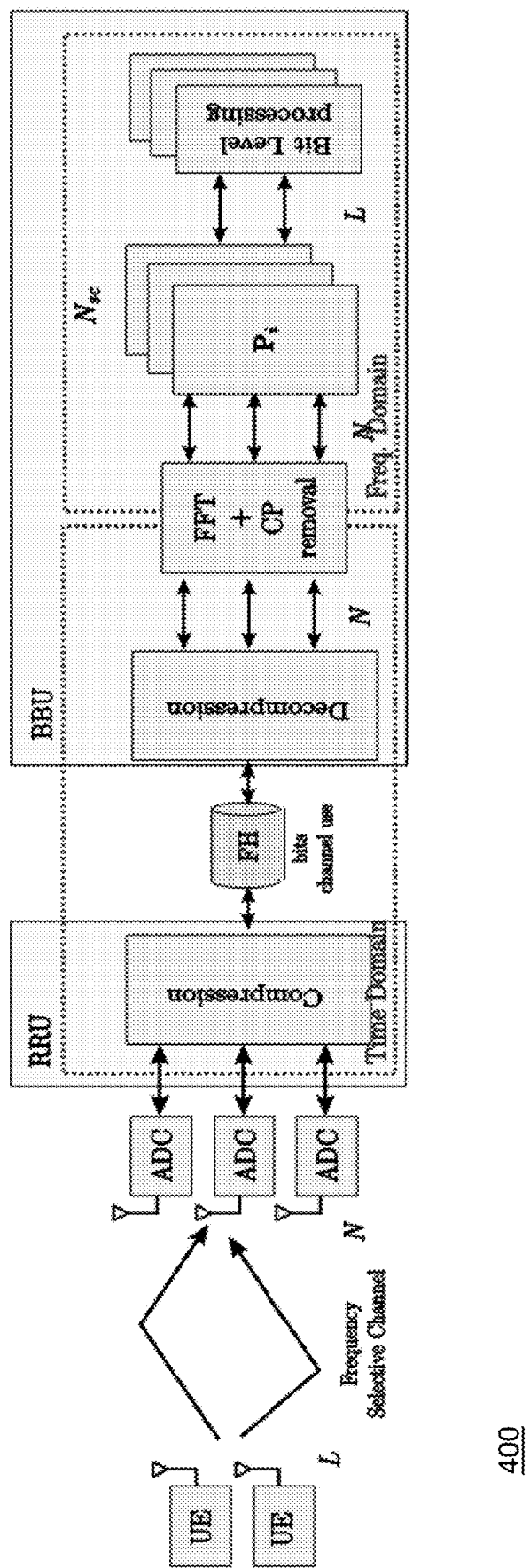
FIG. 4 shows a detailed view of a typical MIMO receiver, which transmits, over an FH link, uplink IQ samples from an RRU through a compression algorithm block towards a BBU through a decompression algorithm block.

As above-mentioned, the present invention may also apply to an uplink MU-MIMO communication system comprising a MIMO receiver 300 as depicted in FIG. 4 and in which the radio frame structure map $\pi$ may be periodically provided to the compression algorithm block at the RRU.

In order to illustrate the advantages and beneficial effects of the present invention within a downlink MU-MIMO communication system 500 as disclosed in FIG. 5, the performance of both the standard CPRI compression technique and the proposed compression technique of the present invention has been compared through numerical simulations.

Figure 12:
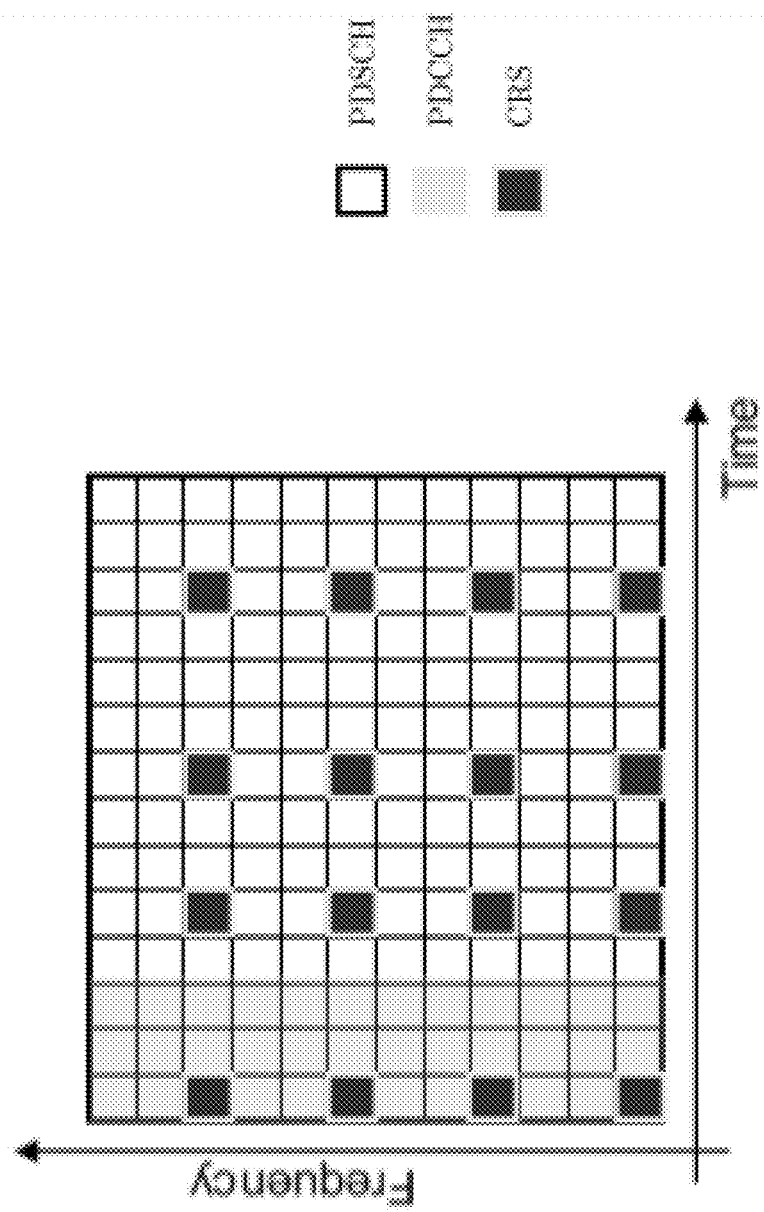
FIG. 12 shows the radio frame structure mapping considered in the numerical simulations for one RB, according to an embodiment of the present invention.

To do so, an exemplary experimental downlink MU-MIMO communication system as depicted in FIG. 5 has been implemented with the following features:

Channel model: LTE 20 MHz model with 100 RBs and 12 subcarriers per RB. The channel matrix H following an uncorrelated Rayleigh fading channel model over all the subcarriers;

BBU node: N=64 antennas;

RRU model: MMSE filtering as aforementioned;

Radio frame structure: Three possible scenarios of radio frame structures (i.e., LTE, LTE with PDCCH spatial multiplexing and 5G) and three data channel types (i.e., PDSCH: multiple streams per user precoded with zero forcing; C-RS: precoded with a fixed wide beam; PDCCH: depending on the scenario from fixed wide beam to zero forcing precoding) have been considered. All the three data channel types have been compressed at the same individual EVM. FIG. 12 shows the radio frame structure mapping considered in the numerical simulations for one RB.

The performance of the disclosed compression procedure with the standard CPRI compression per antenna and two compression embodiments (denoted by fast structural binary coding (FSBC)-AW and FSBC-AG) of the proposed invention is compared. The two compression embodiments may be defined as follows:

FSBC-AW: the whole information from the data frame structure is considered and the T (=3) different data types, namely PDSCH, C-RS and PDCCH, are compressed with three separate compressors;

FSBC-AG: only two groups are considered. The first group is formed of the PDCCH samples and the C-RS REs in the same range as PDCCH, which are compressed with the same compressor. The second group is formed by PDSCH REs and the C-RS in the range of the latter. The covariance of each group is computed by considering the average between the covariance matrix of the several data types involved in the grouping.

When precoding is considered, a zero forcing precoder is assumed, which may be derived as follows:

$$P_{i,j,k} = \alpha H_{i,j,k}(H_{i,j,k}H_{i,j,k}^H)^{-1} \quad (10)$$

where $\alpha = Tr\{P_{i,j,k}P_{i,j,k}^H\}$ is a normalization constant.

To assess the comparative performance, the EVM distortion and the compression gain or ratio (CR) have been investigated as figures of merit.

The EVM has made it possible to measure the average quadratic error between the transmitted symbols X and their reconstruction $\bar{X}$ at the UE devices. The average quadratic error has been averaged over all the carriers with useful information, and EVM has been defined by the following relationship:

$$EVM = \frac{\sum_{i=1}^{N_{sc}} \sum_{j=1}^{N_{slots}} \sum_{k=1}^{N_{OFDM}} E\|\overline{X}(i, jk) - X(i, jk)\|^2}{\sum_{i=1}^{N_{SC}} \sum_{j=1}^{N_{slots}} \sum_{k=1}^{N_{OFDM}} E\|X(i, j, k)\|^2} \quad (11)$$

The compression gain or ratio (CR) has made it possible to compare the FH requirements and has been expressed as:

$$CR = \frac{B_{no-comp}}{B_{method}} \quad (12)$$

where $B_{no-comp}$ features the bits (throughput) required to transmit n vector samples between the BBU and the RRU if no processing/compression is considered, and $B_{method}$ features the bits (throughput) required to achieve the same EVM if some processing/compression is utilized.

In the first scenario, a typical LTE whose parameters are summarized in the following table I is considered:

TABLE I

Parameters for a typical LTE

| | |
|---|---|
| Downlink Test Case | Case 1 (Typical LTE) |
| Number of Antennas | 64 |
| Number of Layers for PDSCH | 16 |
| PDSCH Pre-coding Scheme | Each layer is randomly assigned to one narrow beam |
| Number of C-RS Ports | 2 |
| C-RS Pre-coding Scheme | Fixed Wide Beam |
| PDCCH Overhead | 3 OFDM symbols per sub-frame |
| Maximum Number of PDCCH multiplexed in 1 RB | 1 |
| PDCCH Pre-coding Scheme | 2 stage precoding, first space frequency block coding (SFBC), then Fixed Wide Beam |

Figure 13:
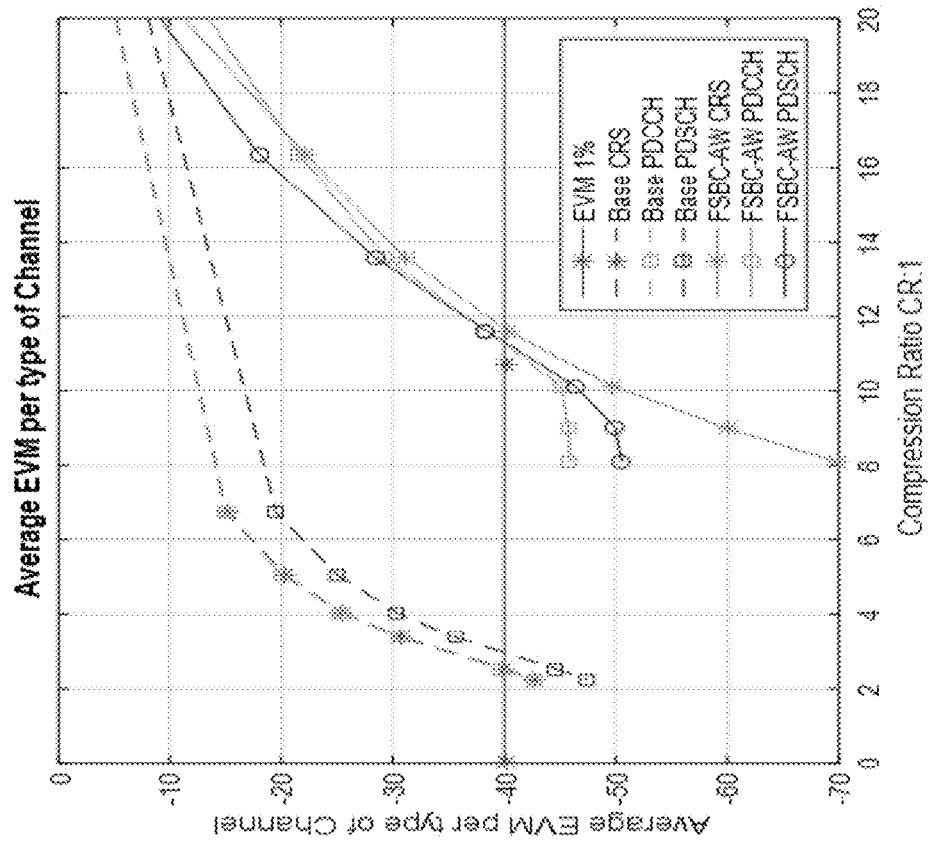
FIG. 13 shows two comparison charts of the average EVM) versus a respective compression ratio (CR) for different data channel types in the case of a typical LTE standard.
Figure 13:
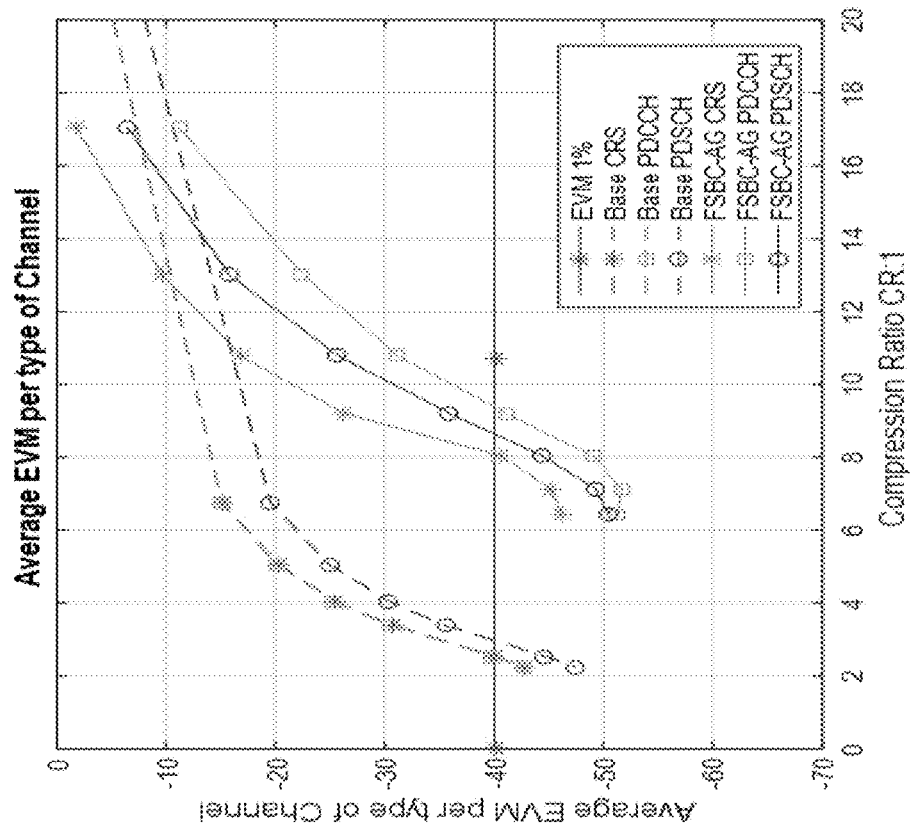

The simulations results are presented in FIG. 13 as comparison charts of the average EVM versus a respective CR for different data channel types in the case of a typical LTE standard. In particular, these simulation results provide for the typical LTE scenario as described in Table I, the average EVM per data channel type averaged over 1000 channel realizations for both a standard CPRI compression procedure (denoted by "Base" in the legend) and the disclosed compression-decompression procedure using the embodiments FSBC-AG and FSBC-AW as denoted therein, with respect to the CR achieved for each procedure. FIG. 13 reveals that the average EVM is better for FSBC-AW.

In the second scenario, a typical LTE with PDCCH spatial multiplexing whose parameters are summarized in the following table II is considered:

TABLE II

Parameters for a typical LTE with PDCCH spatial multiplexing

| | |
|---|---|
| Downlink Test Case | Case 2 (Typical LTE with PDCCH spatial multiplexing) |
| Number of Antennas | 64 |
| Number of Layers for PDSCH | 16 |
| PDSCH Pre-coding Scheme | Each layer is randomly assigned to one narrow beam |
| Number of C-RS Ports | 2 |
| C-RS Pre-coding Scheme | Fixed Wide Beam |
| PDCCH Overhead | 3 OFDM symbols per sub-frame |
| Maximum Number of PDCCH multiplexed in 1 RB | 8 |
| PDCCH Pre-coding Scheme | 2 stage precoding, first SFBC, then each layer is randomly assigned to one narrow beam |

Figure 14:
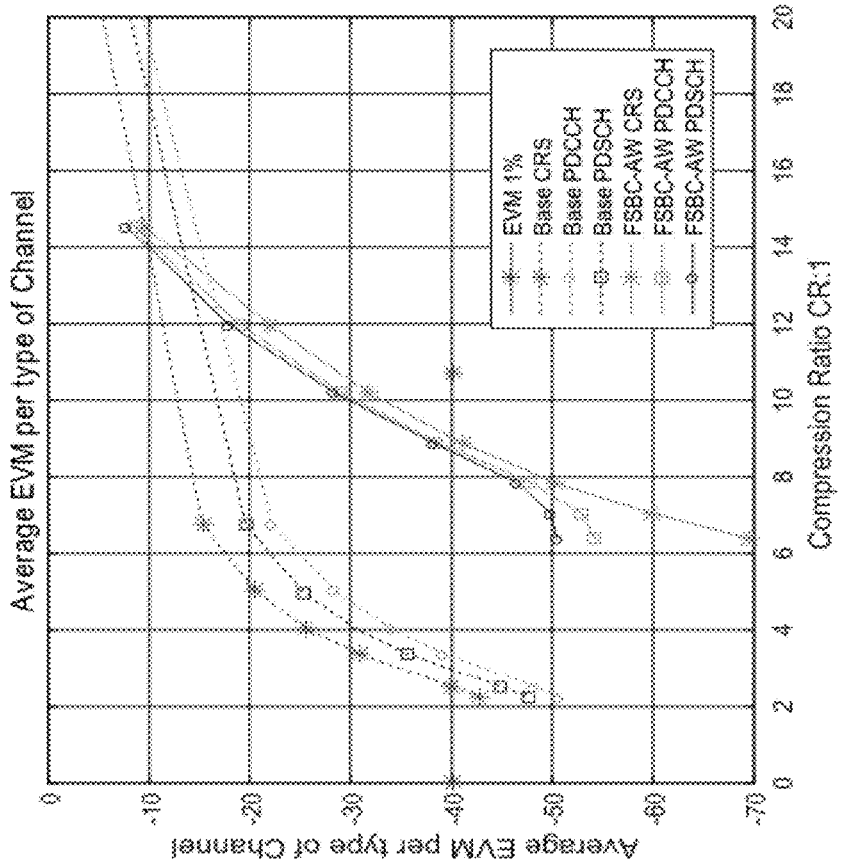
FIG. 14 shows two comparison charts of the average EVM versus a respective CR for different data channel types in the case of a typical LTE standard with physical downlink control channel (PDCCH) spatial multiplexing.
Figure 14:
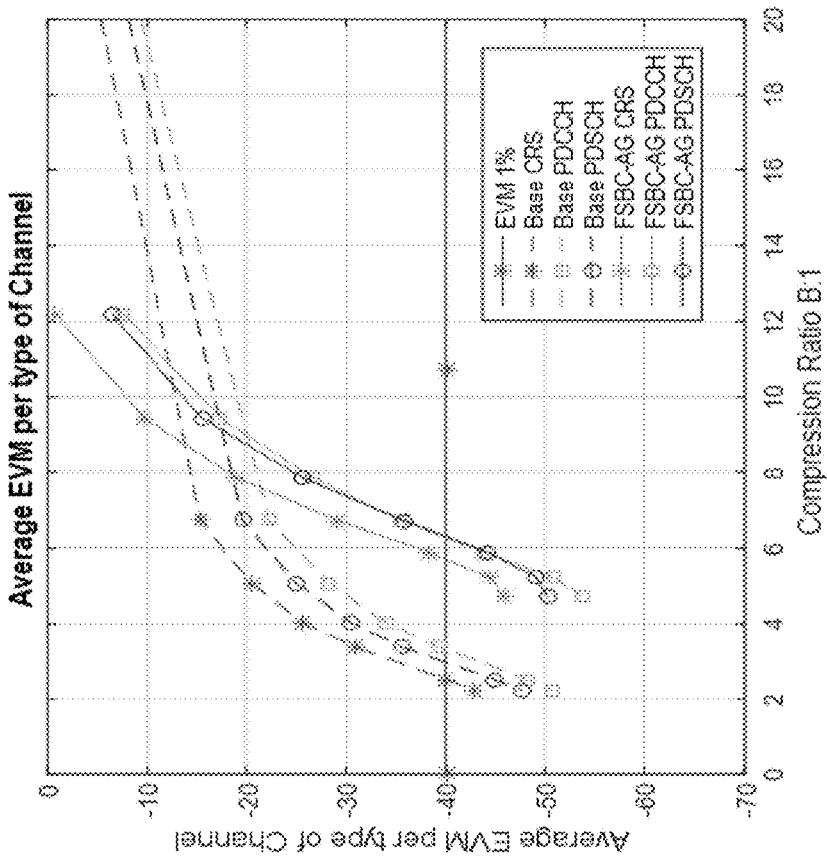

The simulations results are presented in FIG. 14 as comparison charts of the average EVM versus a respective CR for different data channel types in the case of a typical LTE standard with PDCCH spatial multiplexing. In particular, these simulation results provide for the typical LTE scenario with PDCCH spatial multiplexing as described in Table II, the average EVM per data channel type averaged over 1000 channel realizations for both a standard CPRI compression procedure (denoted by "Base" in the legend) and the disclosed compression-decompression procedure using the embodiments FSBC-AG and FSBC-AW as denoted therein, with respect to the CR achieved for each procedure. FIG. 14 reveals that the average EVM is better for FSBC-AW.

In the third scenario, a 5G standard whose parameters are summarized in the following table III is considered:

TABLE III

Parameters for a 5G standard

| | |
|---|---|
| Downlink Test Case | Case 3 (5G) |
| Number of Antennas | 64 |
| Number of Layers for PDSCH | 16 |
| PDSCH Pre-coding Scheme | Each layer is randomly assigned to one narrow beam |
| Number of C-RS Ports | 0 |
| C-RS Pre-coding Scheme | — |
| PDCCH Overhead | 3 OFDM symbols per sub-frame |
| Maximum Number of PDCCH multiplexed in 1 RB | 8 |
| PDCCH Pre-coding Scheme | 2 stage precoding, first SFBC, then each layer is randomly assigned to one narrow beam |

Figure 15:
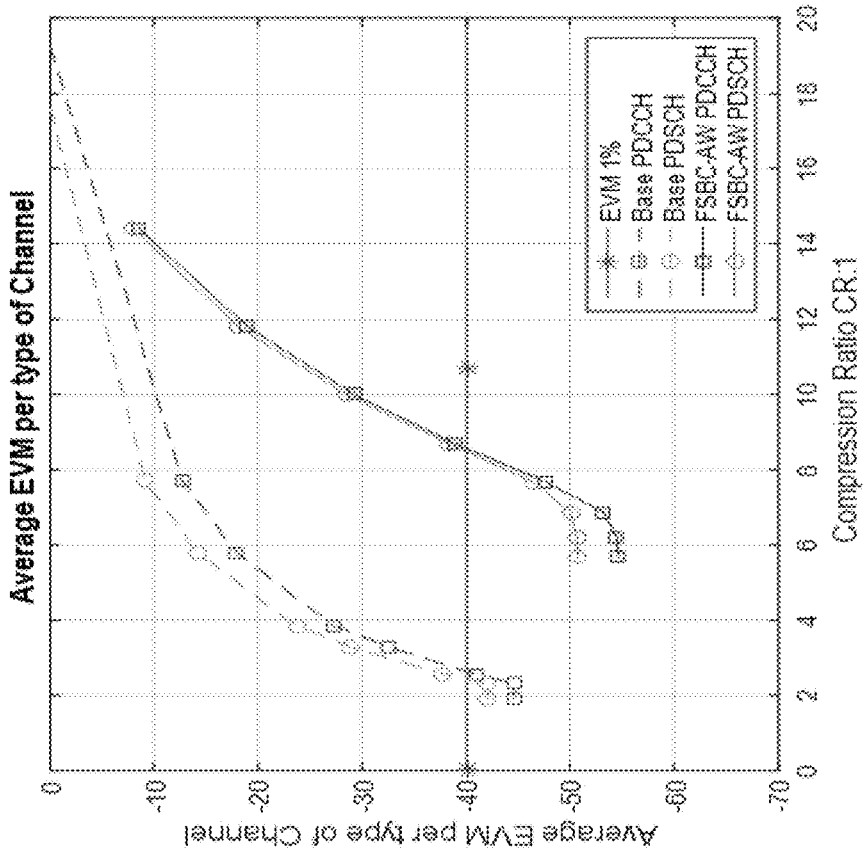
FIG. 15 shows two comparison charts of the average EVM versus a respective CR for different data channel types in the case of a 5G standard.
Figure 15:
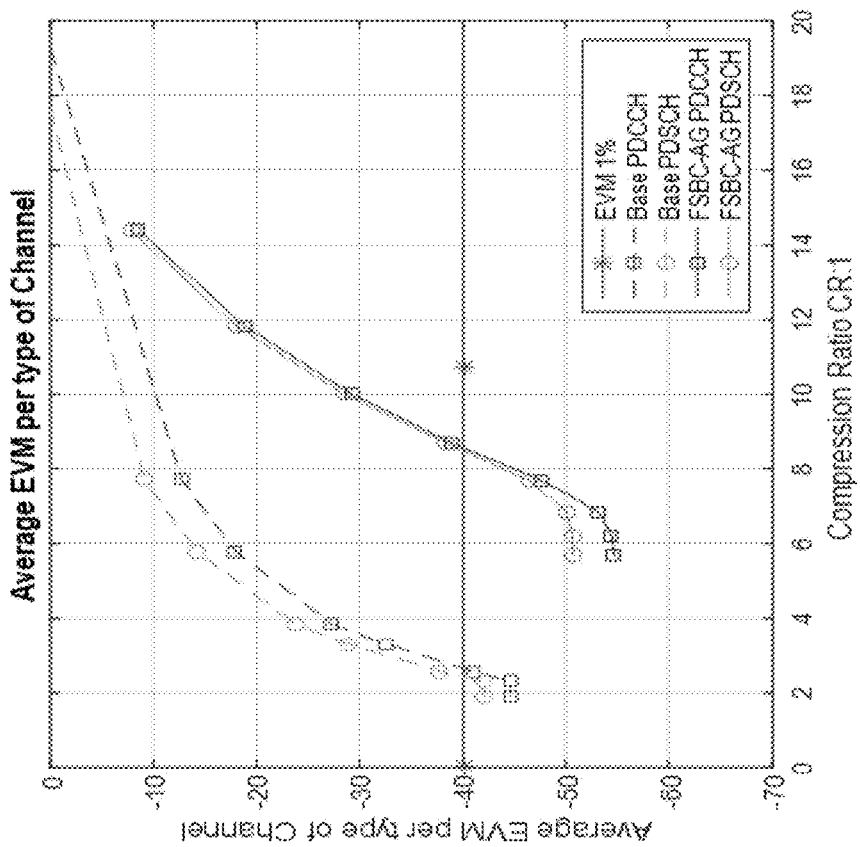

The simulations results are presented in FIG. 15 as comparison charts of the average EVM versus a respective CR for different data channel types in the case of a 5G standard. In particular, these simulation results provide for the 5G standard as described in Table III, the average EVM per data channel type averaged over 1000 channel realizations for both a standard CPRI compression procedure (denoted by "Base" in the legend) and the disclosed compression-decompression procedure using the embodiments FSBC-AG and FSBC-AW as denoted therein, with respect to the CR achieved for each procedure. FIG. 15 reveals that the average EVM is better for FSBC-AW.

As depicted in FIGS. 13, 14 and 15, the EVM at −40 decibel (dB) corresponds to EVM=1%.

From the analysis of the obtained simulation results, the benefits of the present invention can be listed as follows:
the proposed compression-decompression solution of the present invention allows to reduce the FH throughput requirements in order to achieve the same level of EVM or improve the EVM for the same CR (i.e., bitrate) with respect to the state of the art solutions. For illustrative purposes, Table IV compares, for each of the three scenarios (LTE, LTE with PDCCH spatial multiplexing and 5G), the obtained CR values at EVM=−40 dB (i.e., at EVM=1%) for the standard CPRI procedure and the frame agnostic procedures.

TABLE IV

| CR at EVM = 1% Scenario | Standard CPRI | Frame Agnostic | Frame Aware |
|---|---|---|---|
| LTE | 2.5:1 | 8.1:1 | 11.25:1 |
| LTE with PDCCH spatial multiplexing | 2.5:1 | 5.7:1 | 8.7:1 |
| 5G | 2.5:1 | 8.5:1 | 8.5:1 |

CR values at EVM = 1% the proposed compression-decompression solution of the present invention can be implemented with low complexity and the design of the compression parameters per group also results in a reduced complexity; and the proposed compression-decompression solution of the present invention can be implemented with a sample-by-sample compression, thereby resulting in a low delay.

In summary, the present invention relates to an IQ compression/decompression-based solution designed for both downlink and uplink MIMO systems in order to significantly decrease the FH throughput requirements, while guaranteeing an E2E goal of low distortion or EVM. In the downlink, a low distortion or EVM is guaranteed between the symbols intended for each user at the BBU(s) and the symbols received at the corresponding users. In the uplink, a low distortion or EVM is guaranteed between the transmitted users' signals and their reconstruction at the destination. The proposed solution is based on a first module (i.e., a BBU in the case of the MIMO transmitter 200 and an RRU in the case of the MIMO receiver 300) and a second module (i.e., an RRU in the case of the MIMO transmitter 200 and a BBU in the case of the MIMO receiver 300), each exploiting the radio frame structure of the frequency-domain digital signal to be compressed and decompressed. The first module comprises a set of compressors designed each to compress a type of channel data and to exploit the corresponding spatial correlation. The radio frame structure map ($\pi$) is provided to the first module, which thereby selects the respective compressor per data channel type. The radio frame structure map ($\pi$) is also compressed before being forwarded towards the second module. The second module consists of a set of decompressors corresponding each to one compressor in the set of compressors. The compressed radio frame structure map ($\pi$) received at the second module is decompressed and each decompressor can then decompress according to the radio frame structure map ($\pi$). With respect to standard CPRI compression techniques, the proposed invention shows significant compression gains.

While the present invention has been illustrated and described in detail in the drawings and the foregoing description, such illustration and description are to be considered illustrative or exemplary and not restrictive. The invention is not limited to the disclosed embodiments. From reading the present disclosure, other modifications will be apparent to a person skilled in the art. Such modifications may involve other features, which are already known in the art and may be used instead of or in addition to features already described herein.

The invention has been described in conjunction with various embodiments herein. However, other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems.

Although the present invention has been described with reference to specific features and embodiments thereof, it is evident that various modifications and combinations can be made thereto without departing from the spirit and scope of the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. A multi-antenna apparatus of a multi-input multi-output (MIMO) communication system for compressing and decompressing a frequency-domain digital signal, wherein:

the frequency-domain digital signal (X) is composed of frequency-domain digital sub-signals (X(i, j, k)) and is allocated to a respective resource block (RB), each RB comprising multiple resource elements (REs) according to a frequency-time grid;

each frequency-domain digital sub-signal is allocated to a respective RE of the RB; and each frequency-domain digital sub-signal has a data channel type amongst at least one data channel type, the data channel type of each frequency-domain digital sub-signal being determined by a radio frame structure map, the multi-antenna apparatus comprising a respective compressor and a respective decompressor associated with each data channel type, the multi-antenna apparatus being configured to:

for each frequency-domain digital sub-signal of the frequency-domain digital signal, select, at a first module, the respective compressor associated with each data channel type based on each frequency-domain digital sub-signal and the radio frame structure map; compress, at the first module, the frequency-domain digital sub-signal using the selected compressor associated with the data channel type of the frequency-domain digital sub-signal; and for each compressed frequency-domain digital sub-signal, decompress, at a second module communicating with the first module via a fronthaul (FH) communication link, the compressed frequency-domain digital sub-signal using the decompressor associated to the data channel type of compressed frequency-domain digital sub-signal.

2. The multi-antenna apparatus of claim 1, wherein before selecting the respective compressor, the apparatus is further configured to:

receive, from a signal generator at the first module, the frequency-domain digital signal and the radio frame structure map;

detect, at the first module, the frequency-domain digital sub-signals of the frequency-domain digital signal according to the data channel type determined by the radio frame structure map.

3. The multi-antenna apparatus of claim 2, further configured to:
compress, at the first module, the radio frame structure map using a lossless compressor.

4. The multi-antenna apparatus of claim 3, further configured to:
determine, at the first module, a set of compression parameters, which are used for the compression of the detected frequency-domain digital sub-signals per data channel type.

5. The multi-antenna apparatus of claim 4, further configured to:
transmit, the set of compression parameters, the compressed radio frame structure map and the compressed frequency-domain digital sub-signals per data channel type, from the first module towards the second module via the FH link.

6. The multi-antenna apparatus of claim 5, further configured to:
receive, at the second module, the set of compression parameters, the compressed radio frame structure map and the compressed frequency-domain digital sub-signals per data channel type;
decompress, at the second module, the compressed radio frame structure map using the lossless decompressor, as to obtain the radio frame structure map;
detect, at the second module, the compressed frequency-domain digital sub-signals of the compressed frequency-domain digital signal according to the data channel type determined by the radio frame structure map; and
select, at the second module, the respective decompressor per data channel type in order to decompress the compressed frequency-domain digital sub-signals per data channel type.

7. The multi-antenna apparatus of claim 6, further configured to:
provide, at the second module, the set of compression parameters to each decompressor per data channel type, the set of compression parameters being used for the decompression of the detected compressed frequency-domain digital sub-signals per data channel type.

8. The multi-antenna apparatus of claim 7, further configured to:
reconstruct, at the second module, the frequency-domain digital signal using the decompressed compressed frequency-domain digital sub-signals and the radio frame structure map,
wherein the reconstructed frequency-domain digital signal is composed of all the decompressed compressed frequency-domain digital sub-signals allocated to all the REs of the respective RB.

9. The multi-antenna apparatus of claim 8, further configured to:
convert, at the second module, the reconstructed frequency-domain digital signal to a time-domain digital signal.

10. The multi-antenna apparatus of claim 1, wherein the first module is a base band unit (BBU) and the second module is a radio resource unit (RRU).

11. The multi-antenna apparatus of claim 1, wherein the first module is an RRU and the second module is a BBU.

12. A method for compressing and decompressing a frequency-domain digital signal within a multi-input multi-output (MIMO) communication system, wherein:
the frequency-domain digital signal (X) is composed of frequency-domain digital sub-signals (X(i, j, k)) and is allocated to a respective resource block (RB), each RB comprising multiple resource elements (REs) according to a frequency-time grid;
each frequency-domain digital sub-signal is allocated to a respective RE of the RB; and
each frequency-domain digital sub-signal has a data channel type amongst at least one data channel type, the data channel type of each frequency-domain digital sub-signal being determined by a radio frame structure map,
the method comprising:
for each frequency-domain digital sub-signal of the frequency-domain digital signal, selecting, at a first module, a respective compressor associated with each data channel type based on each frequency-domain digital sub-signal and the radio frame structure map; compressing, at the first module, the frequency-domain digital sub-signal using the selected compressor associated with the data channel type of the frequency-domain digital sub-signal; and
for each compressed frequency-domain digital sub-signal, decompressing, at a second module communicating with the first module via a fronthaul (FH) communication link, the compressed frequency-domain digital sub-signal using a decompressor associated to the data channel type of compressed frequency-domain digital sub-signal.

13. The method of claim 12, further comprising:
receiving, from a signal generator at the first module, the frequency-domain digital signal and the radio frame structure map;
detecting, at the first module, the frequency-domain digital sub-signals of the frequency-domain digital signal according to the data channel type determined by the radio frame structure map;
and
compressing, at the first module, the radio frame structure map using a lossless compressor.

14. The method of claim 13, further comprising:
receiving, at the second module, a set of compression parameters from the first module, the compressed radio frame structure map and the compressed frequency-domain digital sub-signals per data channel type;
decompressing, at the second module, the compressed radio frame structure map using the lossless decompressor, as to obtain the radio frame structure map;
detecting, at the second module, the compressed frequency-domain digital sub-signals of the compressed frequency-domain digital signal according to the data channel type determined by the radio frame structure map; and
selecting, at the second module, the respective decompressor per data channel type in order to decompress the compressed frequency-domain digital sub-signals per data channel type.

15. The method of claim 14, further comprising:
reconstructing, at the second module, the frequency-domain digital signal using the decompressed compressed frequency-domain digital sub-signals and the radio frame structure map,
wherein the reconstructed frequency-domain digital signal is composed of all the decompressed compressed frequency-domain digital sub-signals allocated to all the REs of the respective RB.

16. A non-transitory computer readable medium comprising program codes which, when executed by a computer, cause the computer to perform a method for compressing and decompressing a frequency-domain digital signal within a multi-input multi-output (MIMO) communication system, wherein:

the frequency-domain digital signal (X) is composed of frequency-domain digital sub-signals (X(i, j, k)) and is allocated to a respective resource block (RB), each RB comprising multiple resource elements (REs) according to a frequency-time grid;

each frequency-domain digital sub-signal is allocated to a respective RE of the RB; and each frequency-domain digital sub-signal has a data channel type amongst at least one data channel type, the data channel type of each frequency-domain digital sub-signal being determined by a radio frame structure map, the method comprising:

for each frequency-domain digital sub-signal of the frequency-domain digital signal, selecting, at a first module, a respective compressor associated with each data channel type based on each frequency-domain digital sub-signal and the radio frame structure map; compressing, at the first module, the frequency-domain digital sub-signal using the selected compressor associated with the data channel type of the frequency-domain digital sub-signal; and for each compressed frequency-domain digital sub-signal, decompressing, at a second module communicating with the first module via a fronthaul (FH) communication link, the compressed frequency-domain digital sub-signal using a decompressor associated to the data channel type of compressed frequency-domain digital sub-signal.

17. The non-transitory computer readable medium of claim 16, wherein before selecting the respective compressor, the method is further configured to:

receive, from a signal generator at the first module, the frequency-domain digital signal and the radio frame structure map;

detect, at the first module, the frequency-domain digital sub-signals of the frequency-domain digital signal according to the data channel type determined by the radio frame structure map.

18. The non-transitory computer readable medium of claim 17, further configured to:

compress, at the first module, the radio frame structure map using a lossless compressor.

19. The non-transitory computer readable medium of claim 18, further configured to:

determine, at the first module, a set of compression parameters, which are used for the compression of the detected frequency-domain digital sub-signals per data channel type.

20. The non-transitory computer readable medium of claim 19, further configured to:

transmit, the set of compression parameters, the compressed radio frame structure map and the compressed frequency-domain digital sub-signals per data channel type, from the first module towards the second module via the FH link.

* * * * *